(12) United States Patent
Takahashi et al.

(10) Patent No.: US 8,981,507 B2
(45) Date of Patent: Mar. 17, 2015

(54) METHOD FOR MANUFACTURING NONVOLATILE MEMORY DEVICE

(75) Inventors: Shigeki Takahashi, Kanagawa-ken (JP); Kyoichi Suguro, Kanagawa-ken (JP); Junichi Ito, Kanagawa-ken (JP); Yuichi Ohsawa, Kanagawa-ken (JP); Hiroaki Yoda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/534,673

(22) Filed: Jun. 27, 2012

(65) Prior Publication Data

US 2013/0029431 A1    Jan. 31, 2013

(30) Foreign Application Priority Data

Jun. 28, 2011 (JP) .................................. 2011-143417

(51) Int. Cl.
*H01L 43/12* (2006.01)

(52) U.S. Cl.
CPC ....................................... *H01L 43/12* (2013.01)
USPC .... 257/427; 257/421; 257/422; 257/E21.219; 438/3

(58) Field of Classification Search
USPC ................... 428/3; 438/3; 257/421, 422, 427, 257/E21.662
See application file for complete search history.

(56) References Cited

U.S. PATENT DOCUMENTS

| 6,482,657 B2 | 11/2002 | Shimazawa | |
| 2005/0006682 A1* | 1/2005 | Bae et al. | 257/295 |
| 2005/0260189 A1* | 11/2005 | Klibanov et al. | 424/130.1 |
| 2012/0225532 A1* | 9/2012 | Hautala et al. | 438/382 |

FOREIGN PATENT DOCUMENTS

JP    2001-203408    7/2001

OTHER PUBLICATIONS

Background Art Information Sheet with Concise Explanation of Foreign Patent Reference No. 6, undated, in 1 page.
U.S. Appl. No. 13/226,960, filed Sep. 7, 2011, Osawa.
U.S. Appl. No. 13/226,868, filed Sep. 7, 2011, Saida.
U.S. Appl. No. 13/426,139, filed Mar. 21, 2012, Yanagi.

* cited by examiner

*Primary Examiner* — Telly Green
*Assistant Examiner* — Damian A Hillman
(74) *Attorney, Agent, or Firm* — Knobbe, Martens, Olson & Bear LLP

(57) ABSTRACT

According to one embodiment, a method for manufacturing a nonvolatile memory device including a plurality of memory cells is disclosed. Each of the plurality of memory cells includes a base layer including a first electrode, a magnetic tunnel junction device provided on the base layer, and a second electrode provided on the magnetic tunnel junction device. The magnetic tunnel junction device includes a first magnetic layer, a tunneling barrier layer provided on the first magnetic layer, and a second magnetic layer provided on the tunneling barrier layer. The method can include etching a portion of the second magnetic layer and a portion of the first magnetic layer by irradiating gas clusters onto a portion of a surface of the second magnetic layer or a portion of a surface of the first magnetic layer.

21 Claims, 11 Drawing Sheets

US 8,981,507 B2

METHOD FOR MANUFACTURING NONVOLATILE MEMORY DEVICE

CROSS-REFERENCE TO RELATED APPLICATIONS

This application is based upon and claims the benefit of priority from the prior Japanese Patent Application No. 2011-143417, filed on Jun. 28, 2011; the entire contents of which are incorporated herein by reference.

FIELD

Embodiments described herein relate generally to a method for manufacturing nonvolatile memory device.

BACKGROUND

Recently, technology that utilizes a spin transfer torque switching in which a current flowing in a magnetic material causes a magnetization reversal has been drawing attention as a high density nonvolatile memory device. A high density MRAM (Magnetoresistive Random Access Memory) is realized by using such a spin transfer torque switching. The memory cell of the MRAM includes a magnetic tunnel junction (MTJ) device. The MTJ device has a stacked structure in which a storage layer and a reference layer are stacked with a thin tunneling barrier layer interposed. To realize the high density MRAM, it is necessary for the MTJ device to have a size of several tens of nm.

However, materials that are used in the MTJ device such as magnetic metals like cobalt (Co), iron (Fe), etc., generally are materials on which dry etching is not easily performed. Accordingly, the angle of the sidewall of the MTJ device cannot have a shape that is substantially perpendicular when using conventional dry etching (e.g., RIE (Reactive Ion Etching)). For example, in conventional dry etching, the MTJ device has a shape in which the width is wider downward. Generally, in a MTJ device with perpendicular anisotropy, the storage layer is arranged lower than the reference layer to improve the magnetic properties. In the case where the width of the storage layer is larger than the width of the reference layer, the switching properties due to the spin transfer torque undesirably degrade because the leakage magnetic field from the reference layer acts nonuniformly on the storage layer.

Because the MTJ device has a structure in which the storage layer and the reference layer are stacked with the thin tunneling barrier layer interposed, the distance between the storage layer and the reference layer is short. Therefore, in the case where the MTJ device is patterned using dry etching, there is a possibility that redeposition of metal may straddle the tunneling barrier layer to adhere to the storage layer and the reference layer at the sidewall of the MTJ device. In such a case, the storage layer and the reference layer may be shorted and the MTJ device may undesirably become defective because a leak current path forms between the storage layer and the reference layer due to the redeposition. Therefore, the yield of the MTJ device unfortunately decreases.

DETAILED DESCRIPTION

Figure 1:
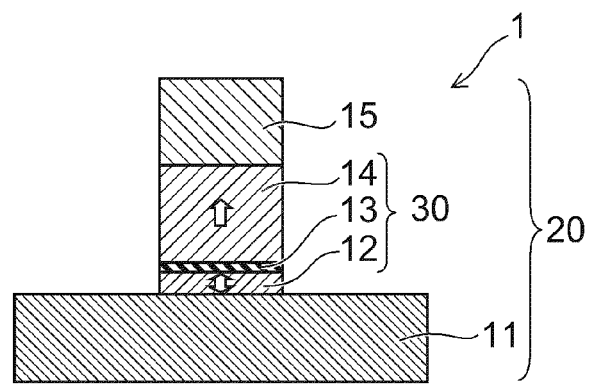
FIG. 1 is a schematic view of the nonvolatile memory device according to a first embodiment.

In general, according to one embodiment, a method for manufacturing a nonvolatile memory device including a plurality of memory cells is disclosed. Each of the plurality of memory cells includes a base layer including a first electrode, a MTJ device provided on the base layer, and a second electrode provided on the MTJ device. The MTJ device includes a first magnetic layer, a tunneling barrier layer provided on the first magnetic layer, and a second magnetic layer provided on the tunneling barrier layer. The method can include etching a portion of the second magnetic layer and a portion of the first magnetic layer by irradiating gas clusters onto a portion of a surface of the second magnetic layer or a portion of a surface of the first magnetic layer.

Embodiments will now be described with reference to the drawings. In the description recited below, similar members are marked with like reference numerals; and a description is omitted as appropriate for members already described.

First Embodiment

First, a nonvolatile memory device 1 manufactured using a method for manufacturing the nonvolatile memory device according to a first embodiment will be described.

FIG. 1 is a schematic view of the nonvolatile memory device according to the first embodiment. A portion of a memory cell of the nonvolatile memory device is illustrated in FIG. 1.

The nonvolatile memory device 1 is a spin transfer torque MRAM using spin transfer torque switching and a magnetoresistive effect. The nonvolatile memory device 1 includes at least one memory cell 20. Other upper interconnects, interlayer dielectric films, etc. (described below) may be provided in the nonvolatile memory device 1.

As illustrated in FIG. 1, each of the memory cells 20 includes a base layer 11 including a lower electrode (a first electrode), a MTJ device 30 provided on the base layer 11 as a memory device, and an upper electrode (a second electrode) 15 provided on the MTJ device 30.

The MTJ device 30 includes a storage layer (a first magnetic layer) 12, a tunneling barrier layer 13 provided on the storage layer 12, and a reference layer (a second magnetic layer) 14 provided on the tunneling barrier layer 13. The MTJ device 30 has a stacked structure stacked in the order of storage layer 12/tunneling barrier layer 13/reference layer 14. The MTJ device 30 may include layers other than this three-layer structure. The MTJ device 30 has a pillar configuration.

The base layer 11 for the crystal orientation is illustrated in FIG. 1 as one layer including a lower electrode and an interconnection. In the first embodiment, the lower electrode and a dedicated base layer for the crystalline orientation may be provided individually and may be stacked. Alternatively, the lower electrode and the base layer for the crystal orientation may be provided as one layer; and the interconnection may be provided separately. The upper electrode 15 also may function as a hard mask.

The storage layer 12 and the reference layer 14 have magnetic anisotropy in directions perpendicular to the film surfaces (the major surfaces) respectively. The easy magnetization axes of the storage layer 12 and the reference layer 14 are perpendicular to the film surfaces (the major surfaces) (hereinbelow called perpendicular magnetization). In other words, the MTJ device 30 is a so-called MTJ device with perpendicular magnetic anistropy in which the magnetization directions of the storage layer 12 and the reference layer 14 are oriented in directions perpendicular to the film surfaces respectively. The film surfaces may be called stacked surfaces because covering films may be stacked on the film surface of the storage layer 12 and the film surface of the reference layer 14.

The easy magnetization axis is the direction for which the internal energy is lowest when the spontaneous magnetization is oriented in that direction without an external magnetic field when assuming a ferromagnet of some macroscopic size. Conversely, the hard magnetization axis is the direction for which the internal energy is highest when the spontaneous magnetization is oriented in that direction without the external magnetic field when assuming the ferromagnet of some macroscopic size.

In the MTJ device 30, information is stored and erased using the magnetization states of the storage layer 12 and the reference layer 14. In the spin transfer torque MRAM, the information is written to the MTJ device by applying the current to the MTJ film in a direction perpendicular to the film surface (the major surface).

For example, spin-polarized electrons are generated by applying the current to the MTJ film in a direction perpendicular to the film surface. The direction of the magnetization (or the spin) of the storage layer 12 reverses due to the angular momentum of the spin-polarized electrons being transferred to the electrons of the storage layer 12. In the MTJ device 30, the magnetization direction of the storage layer 12 reverses according to the current direction. Specifically, the magnetization direction of the storage layer 12 is substantially perpendicular to the major surface of the storage layer 12, and reversible substantially 180° (degrees).

Conversely, the magnetization direction of the reference layer 14 is unchanging (fixed). The magnetization direction of the reference layer 14 being unchanging means that the magnetization direction of the reference layer 14 does not change even in the case where the switching current for reversing the magnetization direction of the storage layer 12 substantially 180° is applied to the reference layer 14. That is, the magnetization direction of the reference layer 14 is fixed to be substantially perpendicular to the major surface of the reference layer 14.

In other words, the storage layer 12 has an easy magnetization axis in a direction substantially perpendicular to the major surface of the storage layer 12; and the magnetization direction of the storage layer 12 is changeable. Conversely, the reference layer 14 has an easy magnetization axis in a direction substantially perpendicular to the major surface of the reference layer 14; and the magnetization direction of the reference layer 14 is fixed.

Accordingly, the MTJ device 30 is formed to include the storage layer 12 having the magnetization direction that is reversible substantially 180° and the reference layer 14 having the unchanging magnetization direction by using a magnetic material having a large switching current as the reference layer 14 and by using a magnetic material having a switching current smaller than that of the reference layer 14 as the storage layer 12.

In the case where the magnetization reversal is caused by the spin-polarized electrons, a difference of the switching current between the storage layer 12 and the reference layer 14 can be provided by appropriately adjusting the damping constant, the anisotropic magnetic field, and the volume of the MTJ film because the switching current of the magnetization reversal is proportional to the damping constant, the anisotropic magnetic field, and the volume of the MTJ film. The arrows of FIG. 1 illustrate the magnetization directions.

The base layer 11 includes a thick metal layer as the lower electrode and a buffer layer on the metal layer for depositing a flat magnetic layer having a perpendicular magnetization. An example of the material of the base layer 11 includes a stacked structure in which at least two metal layers selected from the group consisting of tantalum (Ta), copper (Cu), ruthenium (Ru), iridium (Ir), and the like are stacked. The base layer 11 may have a monolayer structure made of one selected from the group consisting of tantalum (Ta), copper (Cu), ruthenium (Ru), iridium (Ir), and the like. In the case of the monolayer structure, the base layer 11 functions as both the lower electrode and the buffer layer.

The materials of the storage layer 12 and the reference layer 14 may include a ferromagnetic material having an $L1_0$ structure or an $L1_1$ structure such as FePd, FePt, CoPd, CoPt, etc., a ferrimagnetic material such as TbCoFe, etc., and an superlattice made of a stacked structure of a magnetic material such as Ni, Fe, and Co and a nonmagnetic material such as Cu, Pd, and Pt, etc.

The material of the memory layer 12 and the reference layer 14 may include CoFeB showing perpendicular magnetization by a junction with a tunnel barrier layer 13 of oxide such as magnesium oxide etc.

Furthermore, the material of the memory layer 12 and the reference layer 14 may include a stacked structure of CoFeB showing perpendicular magnetization by the above junction with the tunnel barrier layer of oxide such as magnesium oxide etc. with a material showing perpendicular magnetization by itself such as the ferromagnetic material having the $L1_0$ structure or the $L1_1$ structure, the ferrimagnetic material, the superlattice etc.

The material of the tunneling barrier layer 13 may include a dielectric material such as magnesium oxide (MgO), aluminum oxide ($Al_2O_3$), etc.

The material of the upper electrode (the hard mask layer) 15 may include a metal such as tantalum (Ta), tungsten (W), etc., or a conductive compound such as titanium nitride (TiN), tantalum nitride (TaN), titanium silicon nitride (TiSiN), tantalum silicon nitride (TaSiN), etc.

In the first embodiment, the storage layer 12 and the reference layer 14 may be in-plane magnetic films. The storage layer 12 and the reference layer 14 may have magnetic anisotropy in directions parallel to the film surfaces, respectively. In such a case, the easy magnetization axes are parallel to the film surfaces (or the stacked surfaces).

The materials of the storage layer 12 and the reference layer 14 that are in-plane magnetic films may include, for example, a magnetic metal including at least one selected from the group consisting of iron (Fe), cobalt (Co), nickel (Ni), manganese (Mn), and chrome (Cr).

In spin transfer torque switching, the magnetization reversal is executed by a spin transfer torque which is caused by spin-polarized electrons generated by the spin injection current to flow in the MTJ device 30 as the writing current. The magnetization of the magnetic storage layer reverses substantially 180° by the angular momentum of the spin-polarized electrons transferring to the electrons inside the magnetic material used as the magnetic storage layer.

According to such a spin transfer torque switching, it is easier to locally control the magnetization state at the nanoscale; and the switching current also can be reduced as the volume of magnetic material shrinks. This aids the realization of a spintronic device such as a hard disk drive, MRAM, etc., having a high recording density.

Specifically, the writing of the information in the MTJ device 30 is performed as recited below. When writing the information, current flows in the MTJ device 30 bidirectionally in the direction perpendicular to the film surface.

In the case where the write current flows in the direction from the storage layer 12 toward the reference layer 14, the electrons flow in the direction from the reference layer 14 toward the storage layer 12. In such a case, the magnetization of the storage layer 12 receives spin torque in the direction to align the magnetization of the storage layer 12 parallel to the magnetization of the reference layer 14. Therefore, in the case where the direction of the magnetization of the storage layer 12 is antiparallel to the direction of the magnetization of the reference layer 14, the magnetization of the storage layer 12 becomes parallel (has the same direction) to the direction of the magnetization of the reference layer 14 by reversing substantially 180°.

On the other hand, in the case where the writing current flows in the direction from the reference layer 14 toward the storage layer 12, the electrons flow in the direction from the storage layer 12 toward the reference layer 14. In such a case, the magnetization of the storage layer 12 receives spin torque in a direction to align the magnetization of the storage layer 12 antiparallel to the magnetization of the reference layer 14. Therefore, in the case where the direction of the magnetization of the storage layer 12 is parallel to the direction of the magnetization of the reference layer 14, the magnetization of the storage layer 12 becomes antiparallel to the direction of the magnetization of the reference layer 14 by reversing substantially 180°.

In the case where a read current flows in the MTJ device 30 in a direction perpendicular to the film surface, the resistance changes depending on the relative direction of the magnetization between the storage layer 12 and the reference layer 14 due to the magnetoresistive effect. That is, the resistance of the MTJ device 30 is a low resistance state in the case where the directions of the magnetizations of the storage layer 12 and the reference layer 14 are parallel to each other and is a high resistance state in the case where the directions of the magnetizations of the storage layer 12 and the reference layer 14 are antiparallel.

In FIG. 1, the state in which the arrow is drawn upward inside the storage layer 12 is the parallel state; and the state in which the arrow is drawn downward inside the storage layer 12 is the opposingly parallel state. In the first embodiment, for example, the low resistance state is taken as a datum "0;" and the high resistance state is taken as a datum "1." Thereby, one bit of information can be stored in the MTJ device 30. The low resistance state may be taken as the datum "1;" and the high resistance state may be taken as the datum "0."

The value defined by (R1−R0)/R0 is called the magnetoresistance ratio (the MR ratio), where the resistance value of the parallel state is R0 and the resistance value of the antiparallel state is R1. The MR ratio differs by process conditions and materials included in the MTJ device 30. In the first embodiment, the MR ratio is adjusted to be about several tens of percent to several hundreds of percent.

Thus, the nonvolatile memory device 1 performs the read out of the information stored in the MTJ device 30 by utilizing the magnetoresistive effect. The read current of the MTJ device 30 is set to be sufficiently smaller than the switching current of the storage layer 12 that reverses the direction of the magnetization substantially 180°.

Manufacturing processes of the nonvolatile memory device 1 will now be described. In the first embodiment, as described below, a portion of the reference layer 14 and a portion of the storage layer 12 are etched by irradiating ionized gas clusters onto a portion of the surface of the reference layer 14 or a portion of the surface of the storage layer 12. First, an overview of a vacuum processing apparatus that can perform such patterning will be described.

Figure 2:
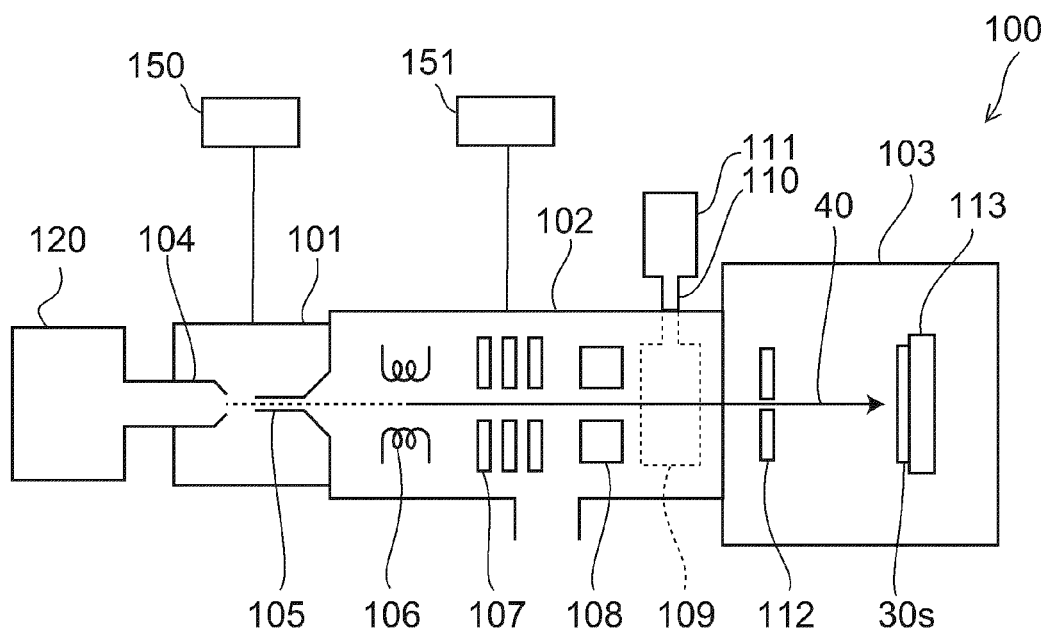
FIG. 2 is a schematic cross-sectional view for describing an overview of the vacuum processing apparatus.

FIG. 2 is a schematic cross-sectional view for describing an overview of the vacuum processing apparatus.

A vacuum processing apparatus 100 illustrated in FIG. 2 is a vacuum processing apparatus that can etch a subject material by generating ionized gas clusters and irradiating the gas clusters onto the subject material.

The vacuum processing apparatus 100 includes a cluster formation chamber 101, an ionization chamber 102, and a process chamber 103. A nozzle 104 is mounted in the cluster formation chamber 101. A high-pressure stagnation region 120 is mounted to the nozzle 104. A skimmer 105 is provided between the cluster formation chamber 101 and the ionization chamber 102.

In the direction from the cluster formation chamber 101 toward the process chamber 103, an ionizer 106, an accelerator 107, a magnet 108, and a pressure cell 109 are provided in the interior of the ionization chamber 102. A gas supply mechanism 111 is provided in the pressure cell 109 via a pipe 110. An inert gas such as, for example, argon (Ar) is filled into the gas supply mechanism 111. A valve (not illustrated) that is configured to control the gas supply from the gas supply mechanism 111 to the pressure cell 109 is provided between the gas supply mechanism 111 and the pressure cell 109.

From the ionization chamber 102 side, an aperture 112 and a substrate holder 113 are provided in the interior of the cluster irradiation chamber 103.

The state in which a processing substrate 30s is disposed on the substrate holder 113 is illustrated in FIG. 2. The processing substrate 30s is a stacked film stacked in the order of base layer 11/MTJ device 30/upper electrode 15. The substrate holder 113 is movable in the inner-plane direction of the processing substrate 30s. Gas clusters having a beam configuration can be irradiated onto the entire surface of the processing substrate 30s by moving the substrate holder 113.

Also, a measurement unit 150 configured to measure the number of the atoms (or the number of the molecules) per gas cluster and a measurement unit 151 configured to measure the acceleration voltage (kV) of the ionized gas clusters are additionally provided in the vacuum processing apparatus 100.

A reduced-pressure atmosphere inside the vacuum processing apparatus 100 is maintained at about $1 \times 10^{-5}$ Torr ($1.3 \times 10^{-3}$ Pa). At least one type of gas selected from the group consisting of a halogen-containing gas ($F_2$, $CHF_3$, $CF_4$, $C_2F_6$, $C_2HF_5$, $CHClF_2$, $NF_3$, $SF_6$, $ClF_3$, $Cl_2$, $HCl$, $CClF_3$, $CHCl_3$, $CBrF_3$, $Br_2$, etc.), carbon dioxide ($CO_2$), carbon monoxide ($CO$), nitrogen ($N_2$), oxygen ($O_2$), ammonia ($NH_3$), dinitrogen monoxide ($N_2O$), methyl ether ($CH_3OCH_3$), and a noble gas (He, Ne, Ar, Kr, and Xe), and the like is filled into the high-pressure stagnation region 120.

When the gas pressurized inside the high-pressure stagnation region 120 is emitted through the nozzle 104 into the cluster formation chamber 101, the gas undergoes adiabatic expansion proximally to the tip of the nozzle 104. Then, the gas is cooled inside the cluster formation chamber 101 to generate multiple gas clusters inside the cluster formation chamber 101. The gas clusters form a beam by flowing through the skimmer 105 and are subsequently guided into the ionization chamber 102. In the ionization chamber 102, an electron beam is irradiated onto the beam of the gas clusters using the ionizer 106. Thereby, the beam of the gas clusters is ionized.

In the ionization chamber 102, gas cluster ions (ionized gas clusters) 40 are generated by about one to several of the molecules or atoms per gas cluster being ionized. The gas used as the gas cluster ions 40 includes at least one type of gas selected from the group consisting of a halogen-containing gas ($F_2$, $CHF_3$, $CF_4$, $C_2F_6$, $C_2HF_5$, $CHClF_2$, $NF_3$, $SF_6$, $ClF_3$, $Cl_2$, HCl, $CClF_3$, $CHCl_3$, $CBrF_3$, $Br_2$, etc.), carbon dioxide ($CO_2$), carbon monoxide (CO), nitrogen ($N_2$), oxygen ($O_2$), ammonia ($NH_3$), dinitrogen monoxide ($N_2O$), methyl ether ($CH_3OCH_3$), and a noble gas (He, Ne, Ar, Kr, and Xe), and the like.

For example, at least one type of gas selected from the group consisting of $F_2$, $CHF_3$, $CF_4$, $NF_3$, $SF_6$, $Cl_2$, $CHCl_3$, $Br_2$, $CO_2$, CO, $N_2$, $O_2$, He, Ne, Ar, Kr, and Xe may be used as the gas cluster ions 40. In other words, the gas used as the gas cluster ions 40 is one type of gas selected from the gases described above or a gas in which two or more of the types are mixed.

The gas cluster is an aggregate of at least one selected from molecules and atoms. For example, the gas cluster is one selected from an aggregate of multiple molecules, an aggregate of multiple atoms, and an aggregate of one or more molecules and one or more atoms. The ionized gas cluster refers to a gas cluster in which at least one to about several of the molecules and the atoms inside the gas cluster are ionized.

The gas cluster ions 40 of the beam are accelerated by the accelerator 107 and are guided into the process chamber 103 by passing through the magnet 108. Then, the gas cluster ions 40 are incident on the processing substrate 30s via the aperture 112 inside the process chamber 103.

In the vacuum processing apparatus 100, the number of the atoms (or the number of the molecules) per gas cluster ion 40 can be appropriately adjusted. Hereinbelow, the number of atoms is described as an example.

Methods for controlling the number of the atoms per gas cluster ion 40 to be lower include increasing the diameter of the throat (the narrowest part) of the nozzle 104 and reducing the gas flow rate supplied to the nozzle 104. Also, the following methods may be used. For example, one gas cluster ion 40 having a relatively large number of atoms (e.g., not more than 10000 atoms) may be bombarded with argon (Ar) supplied from the gas supply mechanism 111 to the pressure cell 109 to subdivide the one gas cluster ion 40 by the bombardment. Thereby, gas clusters having a lower number of atoms are formed.

The kinetic energy per atom or molecule of the gas cluster ions 40 just prior to the gas cluster ions 40 being irradiated onto the processing substrate 30s may be adjusted to a prescribed energy by the accelerator 107 adjusting the acceleration of the gas cluster ions 40. The lower limit of the kinetic energy per atom or molecule of the gas cluster ions 40 just prior to the gas cluster ions 40 being irradiated onto the processing substrate 30s is adjusted to be not less than the threshold energy at which the processing substrate 30s is etched. In the first embodiment, the number of the atoms or molecules per gas cluster ion 40 is adjusted to be, for example, not less than 1000 and not more than 10000. Then, the processing substrate 30s is patterned by the gas cluster ions 40 being irradiated onto the processing substrate 30s.

Figure 3A:
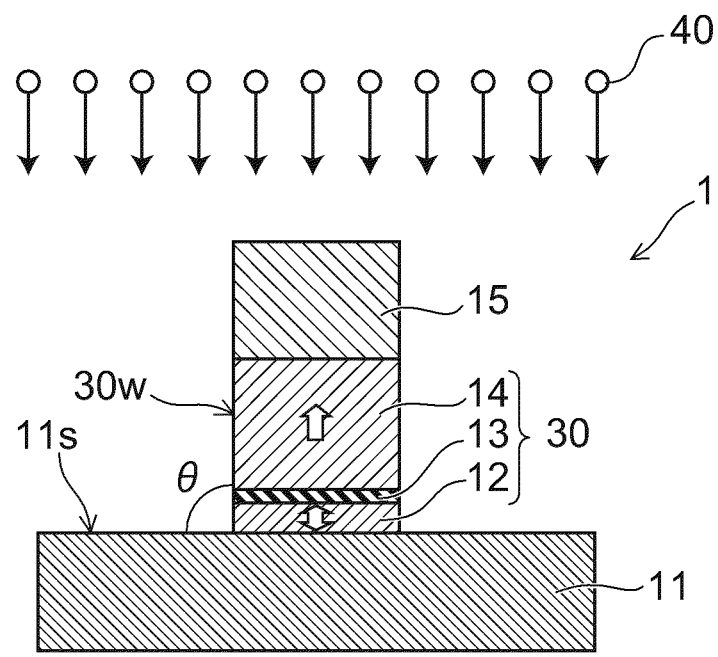
FIGS. 3A and 3B are schematic cross-sectional views illustrating the state of the nonvolatile memory device after the patterning.
Figure 3B:
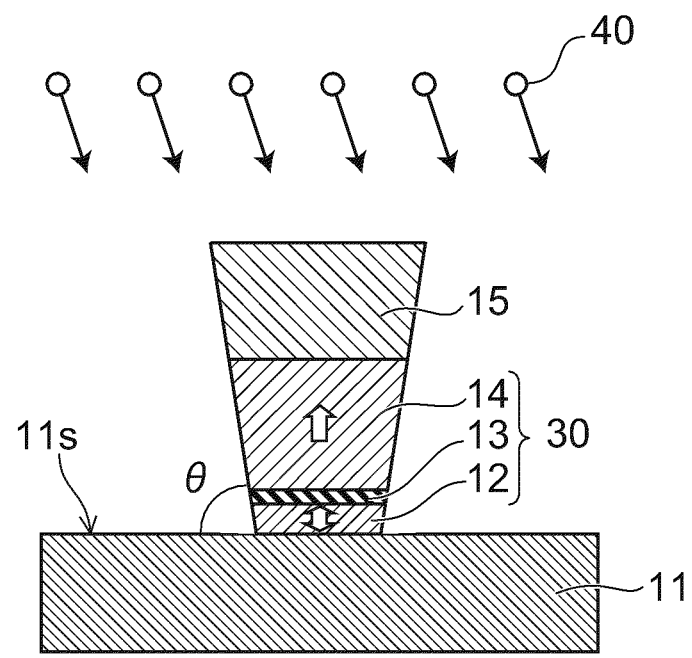

FIGS. 3A and 3B are schematic cross-sectional views illustrating the state of the nonvolatile memory device after the patterning.

As illustrated in FIG. 3A, the reference layer 14, the tunneling barrier layer 13, and the storage layer 12 are patterned in this order using the upper electrode 15 as a mask by the beam of the gas cluster ions 40. For example, the gas cluster ions 40 are irradiated perpendicularly to the major surface of the base layer 11. The gas cluster ions of, for example, a halogen-containing gas are used as the gas cluster ions 40.

In the first embodiment, other than using the upper electrode 15 as the mask, a dedicated hard mask (not illustrated) on the upper electrode 15 may be used. One selected from the group consisting of silicon oxide ($SiO_2$), aluminum oxide ($Al_2O_3$), carbon (C), silicon carbide (SiC), and the like that has superior durability may be used as the material of the hard mask to perform the dry etching of the MTJ device by the irradiation of the beam of the gas cluster ions 40. In the case where the hard mask is used, the upper electrode 15 (e.g., the Ta electrode) is patterned as a contact layer by RIE using the hard mask described above or a resist mask formed on the hard mask.

Subsequently, the reference layer 14, the tunneling barrier layer 13, and the storage layer 12 are etched in this order by the irradiation of the gas cluster ions 40 using the hard mask as a mask. Such a manufacturing method also is included in the first embodiment. In other words, when including the case where the upper electrode 15 itself is used as the mask, at least one material selected from the group consisting of tantalum, silicon oxide, aluminum oxide, carbon, silicon carbide, and the like is used as the material of the mask material.

Here, the surface reaction between the gas cluster ion 40 and the material to be etched (the reference layer 14/tunneling barrier layer 13/storage layer 12) proceeds due to multiple collisions of not less than 1000 particles. Therefore, the surface of the material to be etched selectively reaches a high temperature of about several tens of thousand ° C. Further, the surface of the material to be etched reaches a high pressure of about several tens of GPa. Here, the surface of the material to be etched refers to the surface of the extremely shallow region of the material to be etched and does not include the bulk below the extremely shallow region. Therefore, unlike the surface reaction of monomer ions of conventional RIE, the adsorption, the reaction, and the desorption of the chemical etching process in the first embodiment progresses with the temperature of the material to be etched (the bulk temperature) being about room temperature. As a result, the etching reaction progresses easily for magnetic metals that are hard-to-etch materials using conventional RIE.

In the etching of the first embodiment, processes repeatedly proceed such that the extremely shallow region of the material to be etched is etched to expose the material to be etched under the extremely shallow region, and etching of the extremely shallow region of the exposed surface continues from the exposed surface to expose the material to be etched under this extremely shallow region.

Thereby, as illustrated in FIG. 3A, the MTJ device 30 including the magnetic metal of the hard-to-etch material can be patterned into a configuration in which an angle θ between a sidewall 30w of the MTJ device 30 and the surface 11s of the base layer 11 is substantially perpendicular (θ=90°). In the first embodiment, the MTJ device 30 that has a shape of substantially θ=90° is referred to as the MTJ device 30 having a perpendicular shape.

Then, fine patterning is realized in the first embodiment. For example, the width of the MTJ device 30 after the patterning is several tens of nm (e.g., not more than 40 nm). Here, the width refers to, for example, the shortest length of the MTJ device 30 in a direction parallel to the surface 11s of the base layer 11. In the first embodiment, the width of the reference layer 14 and the width of the storage layer 12 are formed to be substantially equal because the MTJ device 30 having the perpendicular shape is formed.

After the ionized gas clusters are formed beforehand, the kinetic energy per atom or molecule of the gas clusters just prior to the irradiation of the gas cluster ions 40 onto the material to be etched is adjusted to be not more than 30 eV. Thereby, the flatness of the surface of the material to be etched is good; and an etched surface is obtained in which the damage is suppressed as much as possible.

The kinetic energy per atom or molecule of the gas clusters directly prior to the irradiation onto the material to be etched is adjusted as follows.

For example, the number of the atoms (or the molecules) per gas cluster ion 40 is adjusted by the method described above; and the valence of the gas cluster ions 40 is adjusted to be monovalent by the ionizer 106. Then, the gas cluster ions 40 are accelerated to a prescribed velocity by the accelerator 107. The gas cluster ions 40 accelerated to the prescribed velocity are subsequently incident on the material to be etched at the prescribed velocity.

At this time, the gas cluster ions 40 are accelerated to the prescribed velocity by the acceleration voltage (kV) set in the vacuum processing apparatus 100. The kinetic energy per atom or molecule of the gas clusters just prior to the irradiation onto the material to be etched is determined by dividing the value of the acceleration voltage (kV) by the number of the atoms (or the number of the molecules) per gas cluster ion 40. Here, the number of the atoms (or the number of the molecules) can be measured by the measurement unit 150; and the acceleration voltage can be measured by the measurement unit 151. The illustrated value of 30 eV is an example; and values other than this value may be used as the upper limit of the kinetic energy.

Although the number of the atoms (or the number of the molecules) per gas cluster ion 40 actually fluctuates with a prescribed distribution, the value of the acceleration voltage (kV) divided by the mode (the number of the atoms (or the number of the molecules) most frequently measured) of the number of the atoms (or the number of the molecules) per gas cluster ion 40 may be used as the kinetic energy per atom or molecule of the gas clusters.

When etching using the gas cluster ions 40, there is a risk that crater-like recesses may occur in the surface of the material to be etched in the case where the kinetic energy of the clusters is too large. In the case where crater-like recesses occur in the etching surface, the etching surface undesirably becomes uneven and rough. For example, it has been ascertained that, for the MTJ film including the material described above, an unevenness of about 20 nm maximum occurs in the MTJ film when irradiating the gas cluster ions by using, for example, an acceleration voltage of 60 kV on gas cluster ions having a size of about 10000 particles. Here, the size of the gas cluster means the number of the atoms or molecules per gas cluster.

However, the flatness of the etched surface is good when the acceleration voltage of the gas cluster ions 40 is adjusted to be not more than 30 kV and the size of the gas cluster ions 40 is reduced by utilizing the pressure cell 109. Because the gas cluster is an aggregate of multiple molecules or multiple atoms, the size adjustment of the gas cluster ion 40 is performed by adjusting the number of the atoms or molecules per gas cluster.

Thus, it is desirable for the kinetic energy per atom or molecule of the gas clusters just prior to the irradiation of the gas cluster ions 40 onto the material to be etched to be adjusted to be not more than 30 eV.

In the first embodiment as illustrated in FIG. 3B, the gas cluster ions 40 may be irradiated onto the major surface of the base layer 11, for example, non-perpendicularly. The processing substrate 30s may be rotated inside the plane when irradiating the gas cluster ions 40 onto the processing substrate 30s. Or the gas cluster ion beam may be deflected and rotated from normal incidence. Thereby, the angle θ between the sidewall 30w of the MTJ film and the surface 11s of the base layer 11 may be smaller than 90° to form a so-called reverse-tapered MTJ device 30.

It is necessary to pattern the width of the MTJ device 30 to be not more than 100 nm when increasing the capacity of the MRAM. In such a case, it is desirable for the acceleration voltage of the gas cluster ions 40 to be not more than 10 kV. The total energy of the gas cluster ion 40 is determined by the acceleration voltage (kV). In the case where the total energy is large, the heat generation due to the surface reaction between the gas clusters and the material to be etched increases as mentioned above.

At this time, in the case where the width of the MTJ device 30 is not more than 100 nm and the MTJ device 30 has a fine pillar shape, the magnetic material and the mask undesirably reach high temperatures because sufficient heat sink for heat dissipation cannot be ensured. Thereby, abnormal high-rate etching phenomena occur; and loss of the hard mask itself, abnormal etching (e.g., side etching) of the MTJ device 30, and interface interdiffusion of the materials between the stacked films of the MTJ device 30 occur.

On the other hand, the kinetic energy per atom (or molecule) decreases as the acceleration voltage of the gas cluster ions 40 is reduced. Therefore, there are cases where the etching rate undesirably decreases and the process time becomes extremely long. In the first embodiment, the size of the gas clusters is reduced as the acceleration voltage is reduced. In such a case, the process conditions are set such that the kinetic energy per atom (or molecule) does not decrease too much. Thereby, the abnormal etching is suppressed; and the decrease of the etching rate also is suppressed.

More specific manufacturing processes of the first embodiment will now be described.

FIG. 4A to FIG. 7B are schematic cross-sectional views illustrating manufacturing processes of the nonvolatile memory device according to the first embodiment. The schematic cross-sectional views of FIG. 4A to FIG. 7B correspond to the orientation of the cross section of FIG. 1.

Figure 4A:
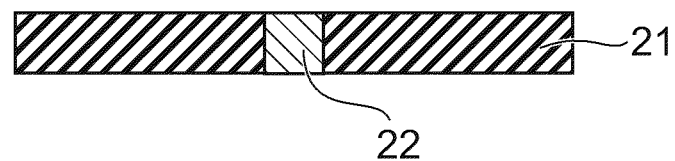
FIG. 4A to FIG. 7B are schematic cross-sectional views illustrating manufacturing processes of the nonvolatile memory device according to the first embodiment.

First, after preparing an interlayer dielectric film 21 as illustrated in FIG. 4A, a contact 22 is formed inside the interlayer dielectric film 21 to electrically connect to a lower interconnect, a MOS transistor, etc. The interlayer dielectric film 21 is formed on the MOS transistors, the layers from the FEOL (Front End Of Line) processes, and the like that are formed on the semiconductor substrate (not illustrated).

The upper surface of the interlayer dielectric film 21 may be planarized using CMP (Chemical Mechanical Polishing) and etch-back. For example, silicon oxide ($SiO_2$) may be used as the material of the interlayer dielectric film 21. For example, tungsten (W) may be used as the material of the contact 22.

Figure 4B:
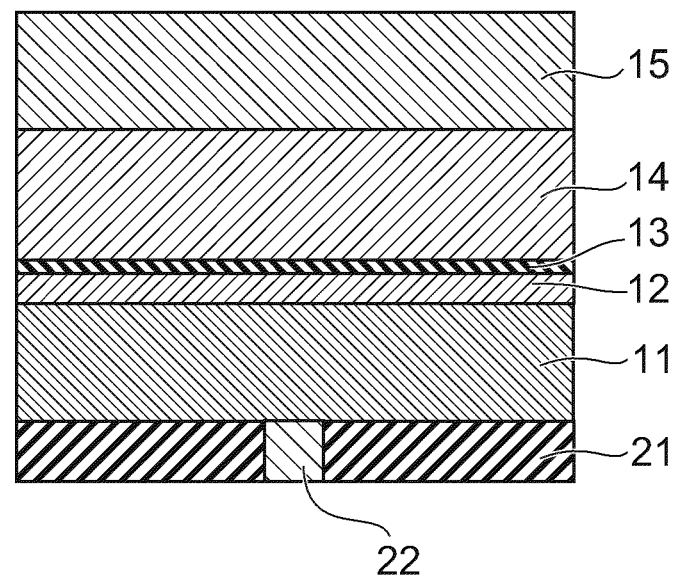

Then, as illustrated in FIG. 4B, the base layer 11, the storage layer 12, the tunneling barrier layer 13, the reference layer 14, and the upper electrode 15 are formed in this order to cover the contact 22 by, for example, sputtering.

The base layer 11 is a layer necessary to connect to the contact 22 and deposit a flat magnetic layer having a perpendicular magnetization. For example, a ferromagnetic material having an $L1_0$ structure or an $L1_1$ structure such as FePd, FePt, CoPd, CoPt, etc., a ferrimagnetic material such as TbCoFe, etc., and a superlattice made of a stacked structure of a magnetic material such as Ni, Fe, and Co and a nonmagnetic material such as Cu, Pd, and Pt, etc., may be used as the materials of the storage layer 12 and the reference layer 14. The material of the memory layer 12 and the reference layer 14 may include CoFeB showing perpendicular magnetization by a junction with a tunnel barrier layer 13 of oxide such as magnesium oxide etc.

Furthermore, the material of the memory layer 12 and the reference layer 14 may include a stacked structure of CoFeB showing perpendicular magnetization by the above junction with the tunnel barrier layer of oxide such as magnesium oxide etc. with a material showing perpendicular magnetization by itself such as the ferromagnetic material having the $L1_0$ structure or the $L1_1$ structure, the ferromagnetic material, the superlattice etc. For example, magnesium oxide (MgO) may be used as the tunneling barrier layer 13. There are cases where the reference layer 14 includes a bias magnetic field layer that functions to cancel the leakage magnetic field from the reference layer 14. Similarly, there are cases where the base layer 11 includes a biasing layer.

The upper electrode 15 illustrated in FIG. 4B also is used as a hard mask layer. For example, tantalum (Ta) may be used as the material of the upper electrode 15.

At this stage, the storage layer 12, the tunneling barrier layer 13, the reference layer 14, and the upper electrode 15 have so-called blanket configurations.

Figure 5A:
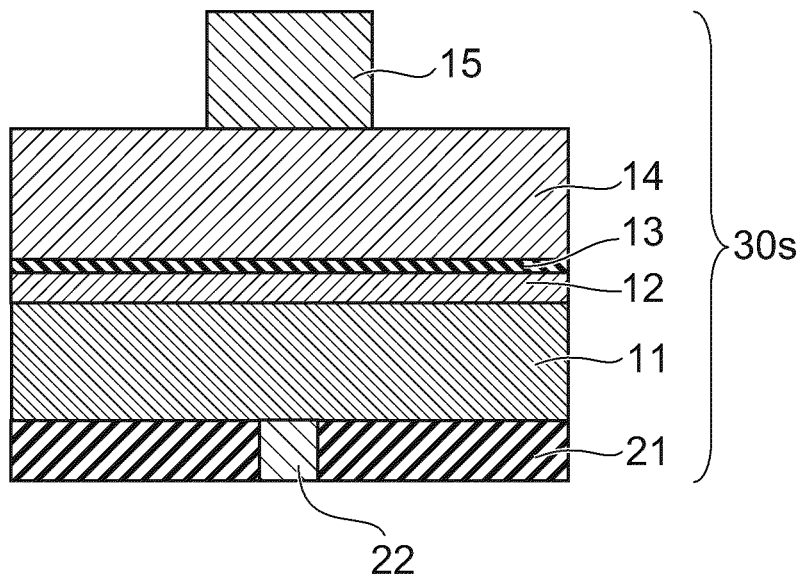

Then, as illustrated in FIG. 5A, the upper electrode 15 is patterned using photolithography and anisotropic etching. To pattern the upper electrode 15, a mask (not illustrated) made of a photoresist is formed beforehand on the upper electrode 15 that has the blanket configuration. The upper electrode 15 is patterned by anisotropic etching (e.g., RIE) using this mask. At this stage, the processing substrate 30s described above is formed. Then, the processing substrate 30s is disposed inside the vacuum processing apparatus 100 described above.

Figure 5B:
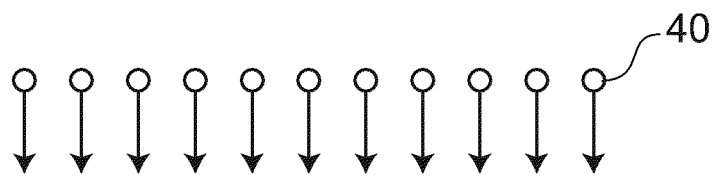
Figure 5B:
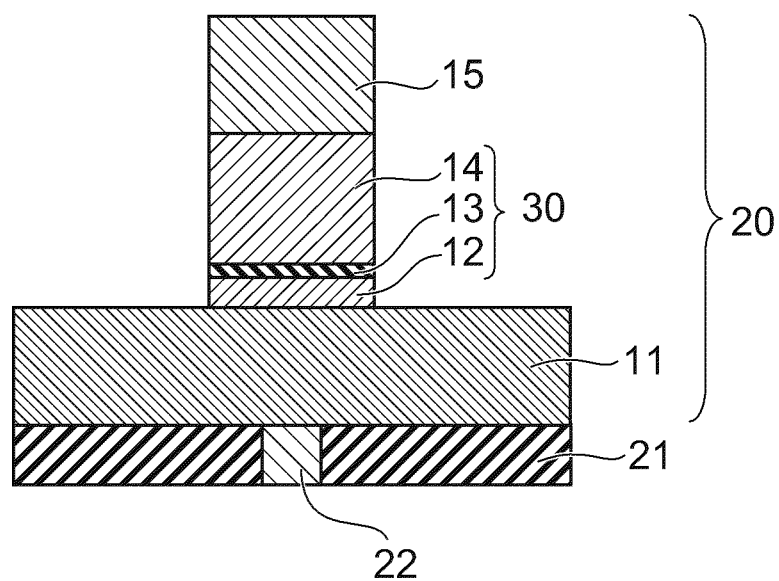

Continuing as illustrated in FIG. 5B, the reference layer 14, the tunneling barrier layer 13, and the storage layer 12 are etched in this order by the beam of the gas cluster ions 40. For example, the reference layer 14 exposed from this mask is first etched using the upper electrode 15 as a mask; then, the tunneling barrier layer 13 exposed from the reference layer 14 is etched; and then the storage layer 12 exposed from the tunneling barrier layer 13 is etched.

Thereby, the memory cell 20 is formed. At this stage, the MTJ device 30 included in the memory cell 20 has a pillar shape in which the sidewall of the MTJ device 30 is substantially perpendicular to the surface of the base layer 11 (referring to FIG. 1).

Figure 6A:
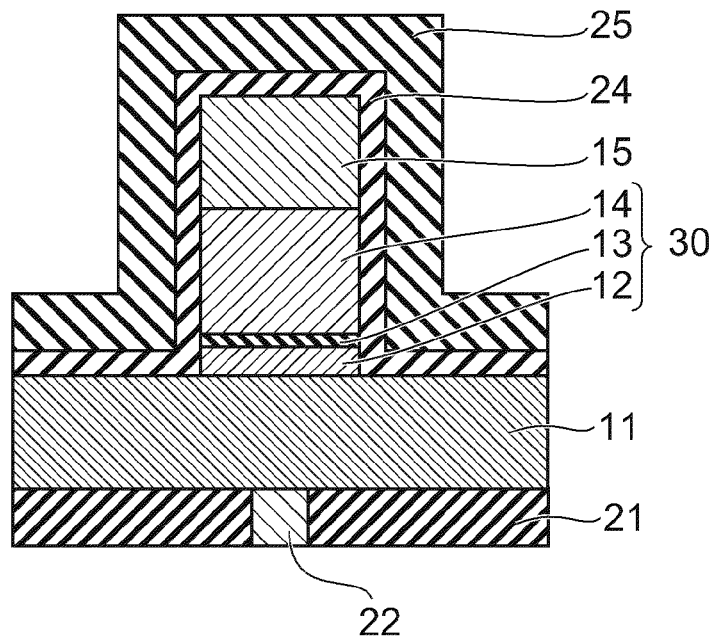

Then, as illustrated in FIG. 6A, the surface of the memory cell 20 made of the base layer 11, the storage layer 12, the tunneling barrier layer 13, the reference layer 14, and the upper electrode 15 is covered with a thin insulating film 24. This is performed such that a gap is not made between the memory cell 20 and the insulating film 24 at this time. This is because there is a possibility that the gap may expand in the case where there is a gap between the memory cell 20 and the insulating film 24 due to the heat treatment, etc., of the back-end processes; and thereby, the MTJ device 30 may be damaged and the characteristics of the MTJ device 30 may degrade.

Continuing, after forming the insulating film 24, an interlayer dielectric film 25 is formed on the entire surface of the insulating film 24. The material of the interlayer dielectric film 25 is, for example, silicon oxide ($SiO_2$) or silicon nitride ($Si_3N_4$). The upper surface of interlayer dielectric film 25 may be planarized using, for example, CMP.

Figure 6B:
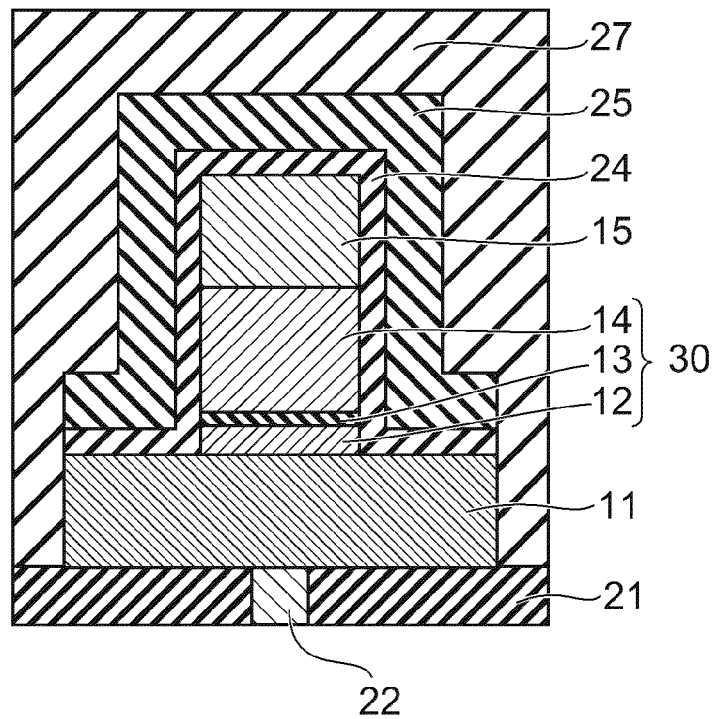

Then, as illustrated in FIG. 6B, the interlayer dielectric film 25, the insulating film 24, and the base layer 11 are patterned using anisotropic etching to isolate the adjacent memory cells from each other. This patterning is performed by, for example, forming a mask (not illustrated) made of a photoresist after planarizing the upper surface of the interlayer dielectric film 25 and by patterning the interlayer dielectric film 25, the insulating film 24, and the base layer 11 using this mask.

Continuing, an interlayer dielectric film 27 is deposited to cover the patterned interlayer dielectric film 25, insulating film 24, and base layer 11.

Figure 7A:
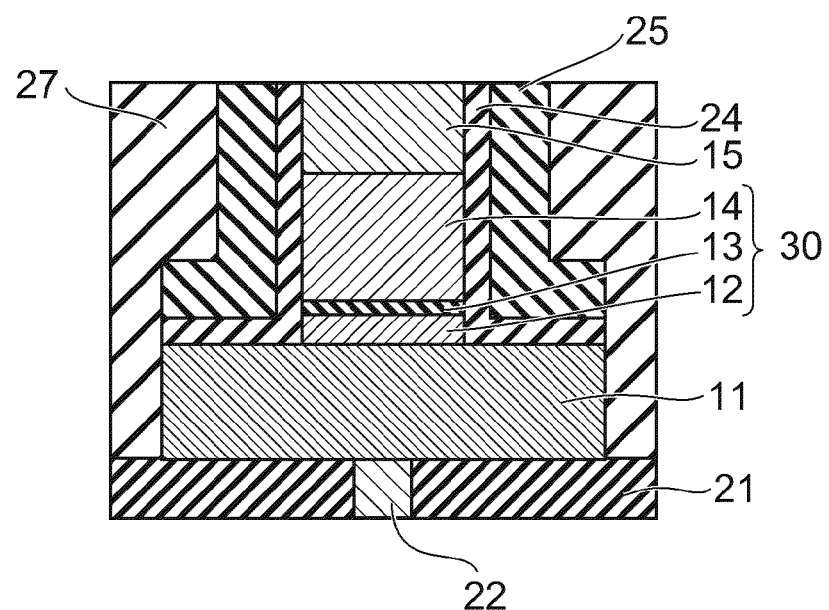

Then, as illustrated in FIG. 7A, the interlayer dielectric film 27 is planarized using CMP. Continuing, the interlayer dielectric film 27, the interlayer dielectric film 25, and the insulating film 24 are polished to expose the upper surface of the upper electrode 15.

Figure 7B:
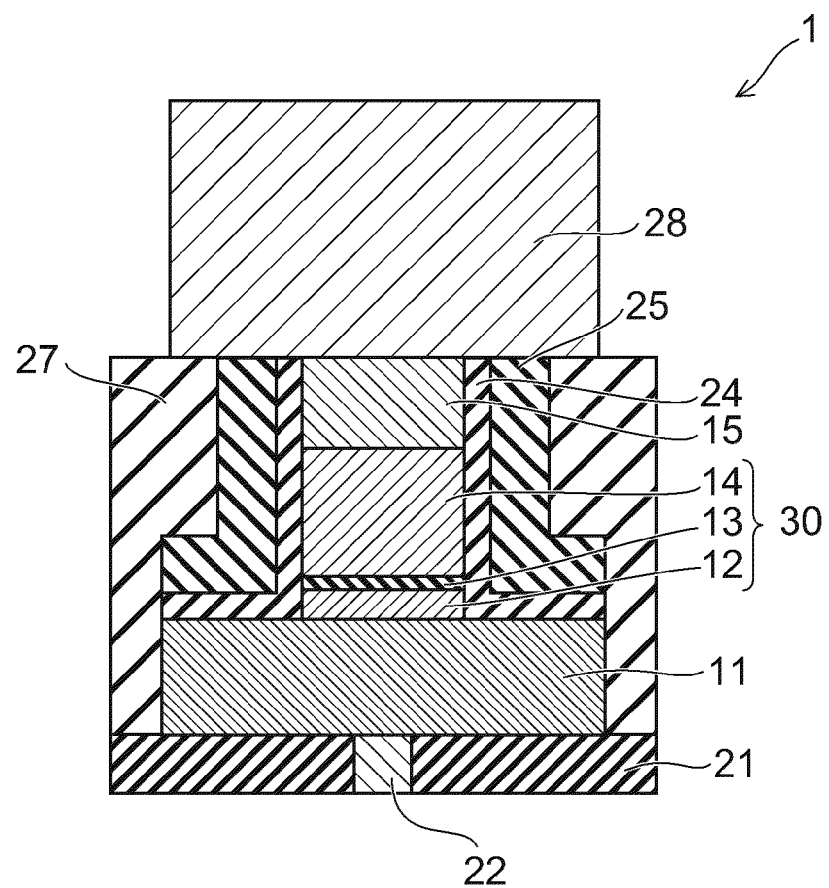

Then, as illustrated in FIG. 7B, an upper interconnect 28 is formed on the MTJ device 30 to be electrically connected to the upper electrode 15. The material of the upper interconnect 28 may include, for example, aluminum (Al), copper (Cu), etc.

The irradiation of the gas cluster ions 40 may be applied to aftertreatment. For example, the kinetic energy per atom or molecule of the gas clusters is reduced by reducing the voltage that accelerates the gas cluster ions 40 and increasing the size of the gas clusters. In such a case, the gas cluster ions 40 are formed of an inert gas such as nitrogen (N), a noble gas, etc. Subsequently, the gas cluster ions 40 are irradiated onto the surface of the processing substrate 30s.

By irradiating such gas cluster ions 40 onto the surface of the processing substrate 30s, chlorides and the like adhered to the surface of the processing substrate 30s can be easily removed.

Thus, the nonvolatile memory device 1 according to the first embodiment is formed.

As described above, the storage layer 12 that is usable in the MTJ device 30 may include a perpendicular magnetic film in which the magnetization direction is oriented in the direction perpendicular to the film surface and an in-plane magnetic film in which the magnetization direction is oriented in the in-plane direction. In the case where the perpendicular magnetic film is employed, a magnetic field having a large perpendicular component acts on the storage layer 12 because the leakage magnetic field occurring due to the magnetization of the reference layer 14 is oriented toward the direction perpendicular to the film surface of the storage layer. The leakage magnetic field from the reference layer 14 acting on the storage layer 12 normally acts to cause the magnetization of the storage layer 12 to be parallel to the magnetization of the reference layer 14. Then, it is conceivable that such a MTJ device 30 can be patterned using conventional RIE.

However, magnetic metals are materials that are hard-to-etch by RIE. For example, even in the case where a magnetic metal is etched using RIE, it is known that the reaction products produced at the surface of the processing substrate 30s during the etching do not easily volatilize. In RIE, measures can be taken to increase the temperature of the magnetic metal to a high temperature (e.g., 300° C. or more) during the etching to increase the volatility of the reaction products. However, when the magnetic metal is exposed to the etching gas at the high temperature, only specific components inside the magnetic metal are selectively etched; and there are cases where side etching of a portion of the memory cell 20 occurs locally. This leads to the degradation of the MTJ device 30.

On the other hand, the etching itself does not easily occur in the case where the temperature of the magnetic metal in the RIE is lower than 300° C. Even when the magnetic metal is etched in such a case, the actual cross-sectional shape of the MTJ device 30 undesirably has a so-called forward-tapered shape. That is, the width of the storage layer 12 becomes larger than the width of the reference layer 14. In such a shape, the leakage magnetic field from the reference layer 14 acts nonuniformly on the storage layer 12. Therefore, the magnetization reversal properties due to the spin injection undesirably degrade as the MTJ device 30 is used.

As described above, the distance between the storage layer 12 and the reference layer 14 in the MTJ device 30 is short. Therefore, when the etching of the MTJ device 30 is attempted using RIE, there is a possibility that a redeposition of metal may straddle the tunneling barrier layer and adhere to the sidewall of the MTJ device 30. Thereby, current leakage occurs between the storage layer 12 and the reference layer 14; and the MTJ device 30 is undesirably defective.

In RIE, it is also necessary to successively change the etching conditions (the input power, the gas type, the chamber pressure, etc.) for each layer to perform the optimal etching for each layer of the memory cell. Accordingly, the process conditions are complex.

In RIE, there are cases where a cascade impingement phenomenon from the surface of the material to be etched to the interior occurs and the material to be etched is damaged because ions having a single atom to several atoms are used. In RIE as mentioned above, there are cases where etching gas species are implanted into the surface of the material to be etched by the cascade impingement phenomenon due to the ion irradiation and components of the etching gas species remain on the etching surface. Components of the etching gas species remaining in the interior of the MTJ device 30 may cause the MTJ device 30 to corrode as the MTJ device 30 is used.

Conversely, in the first embodiment, the magnetic metal exposed from the hard mask is etched by the beam of the gas cluster ions 40. The beam of the gas cluster ions 40 is perpendicularly incident on the major surface of the material to be etched. In such a case, only the surface of the magnetic metal involved in the reaction reaches a high temperature (several tens of thousand ° C.); and the bulk temperature of the magnetic metal under the surface is maintained at a temperature near room temperature. Accordingly, only the surface of the material to be etched that is exposed from the hard mask is etched efficiently; and the reaction products produced at the surface of the material to be etched volatilize efficiently from the surface of the material to be etched.

Furthermore, when performing etching using a mechanism of a surface reaction arising from multibody collision of a large number of particles such as the above by the gas cluster ions 40, selective etching to each element, which is likely to occur in the etching by the conventional RIE, is hard to occur. Therefore, also in the MTJ device 30 formed from various elements such as the above, damage due to a composition shift by the selective etching to each element on the etching surface is small.

Thereby, as illustrated in FIG. 3A, the MTJ device 30 having the perpendicular shape is formed. In other words, the width of the storage layer 12 is substantially the same as the width of the reference layer 14. By obtaining such a perpendicular shape, the magnetization reversal properties due to the spin injection do not degrade easily even when the MTJ device 30 is used for a long period of time. Further, the redeposition of metal does not easily adhere to the sidewall of the MTJ device 30. As a result, current leakage also does not occur easily.

In the first embodiment, side etching of the MTJ device 30 does not occur because the beam of the gas cluster ions 40 is irradiated perpendicularly to the major surface of the material to be etched. The cascade impingement phenomenon described above also does not occur easily because the kinetic energy per atom or molecule of the gas cluster ions 40 is adjusted to be not more than 30 eV. Therefore, the components of the etching gas species do not remain in the interior of the MTJ device 30. In other words, the degradation, the damage, and the corrosion of the MTJ device 30 according to the first embodiment are suppressed.

In the memory cells 20 of a nonvolatile memory device having a large capacity, the MTJ devices 30 are arranged periodically with a narrow pitch of not more than several hundred nm in the direction substantially perpendicular to the direction in which the pillar shapes extend. In the first embodiment, the beam of the gas cluster ions 40 is irradiated perpendicularly to the major surface of the base layer 11. Therefore, the gas cluster ion beam is not easily shielded by the adjacent memory cells 20 when patterning each of the memory cells 20. In other words, the beam of the gas cluster ions 40 reliably reaches the base layer 11.

Thereby, a MTJ device 30 having a high aspect ratio and a narrow pitch is formed; and a high-density nonvolatile memory device is obtained.

Thus, according to the first embodiment, the degradation of the spin transfer torque switching properties of the MTJ device is suppressed. Further, the nonvolatile memory device can be manufactured with high fabrication yields.

Second Embodiment

Figure 8A:
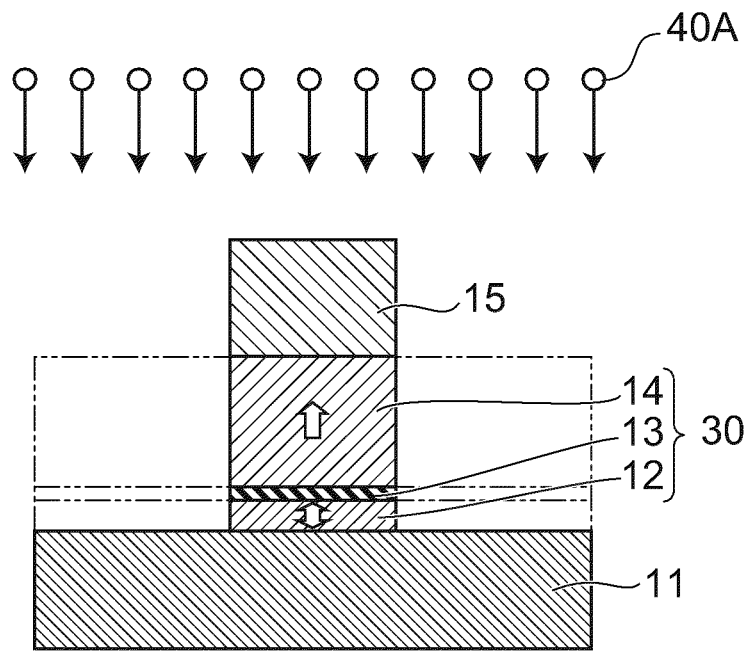
FIGS. 8A and 8B are schematic cross-sectional views illustrating the manufacturing processes of the nonvolatile memory device according to a second embodiment.
Figure 8B:
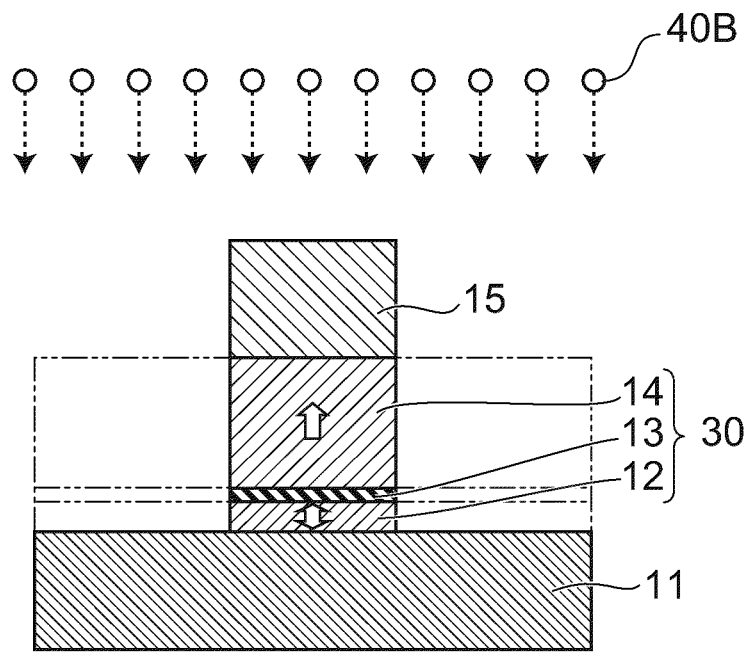

FIGS. 8A and 8B are schematic cross-sectional views illustrating the manufacturing processes of the nonvolatile memory device according to a second embodiment.

In the second embodiment, a first gas and a second gas that have different gas types are used as the gas cluster ions 40. In the second embodiment, the gas types of the gas clusters are irradiated while being modified alternately. For example, the ionized gas clusters of the first gas and the ionized gas clusters of the second gas having a gas type different from the gas type of the first gas are alternately irradiated onto a portion of the surface of the reference layer 14 or a portion of the surface of the storage layer 12.

For example, gas cluster ions 40B of nitrogen ($N_2$), oxygen ($O_2$), or argon (Ar) which is the second gas are irradiated onto a portion of the surface of the reference layer 14 or a portion of the surface of the storage layer 12 as illustrated in FIG. 8B after gas cluster ions 40A of chlorine ($Cl_2$) which is the first gas are irradiated onto a portion of the surface of the storage layer 12 or the reference layer 14 as illustrated in FIG. 8A. Then, the processing illustrated in FIG. 8A and the processing illustrated in FIG. 8B are alternately repeated.

In other words, in the second embodiment, the gas cluster ions 40B of nitrogen, oxygen, or argon are irradiated onto the material to be etched after the material to be etched is etched by the gas cluster ions 40A of chlorine; or the gas cluster ions 40A are irradiated onto the material to be etched after the material to be etched is etched by the gas cluster ions 40B. Thus, a portion of the reference layer 14 and a portion of the storage layer 12 are etched.

The desorption energy is high for first reaction products (e.g., chlorides of Co, Fe, etc.) produced at the surface of the material to be etched by the irradiation of the gas cluster ions of the first gas; and there is a possibility that the first reaction products may not easily be desorbed from the surface of the material to be etched. In the second embodiment, the first reaction products are replaced with second reaction products (e.g., oxychloride of Co, Fe, etc.) that have low desorption energy by irradiating the gas cluster ions of the second gas onto the first reaction products. Thereby, the desorption energy is reduced; and the reaction products are easily desorbed from the surface of the material to be etched. Thereby, the reaction products produced at the surface of the material to be etched are efficiently desorbed from the surface of the material to be etched.

For example, in the first embodiment, the corrosion of the magnetic materials, etc., included in the MTJ device 30 are suppressed by irradiating the gas cluster ions 40B of the other gas type after the etching of the MTJ device 30 by the gas cluster ions 40A of $Cl_2$ gas.

For example, by irradiating the gas cluster ions 40B of $N_2$ gas with a dose to provide an etching amount of not more than 1 nm, the desorption of the Cl atoms of the etching surface etched with the $Cl_2$ is promoted; and one type of passivation film can be formed on the surface of the MTJ device 30 to suppress the penetration of $O_2$ and $H_2O$ when exposed to the atmosphere. Thereby, the corrosion of the magnetic materials, etc., can be prevented. Other than the $N_2$ gas, corrosion suppression effects of the magnetic materials, etc., are provided even in the case where gas cluster ions 40B of $O_2$ gas, Ar gas, etc., are used similarly in the aftertreatment.

The etching may be implemented by mixed gas cluster ions made by mixing the gas source of the gas cluster ions 40A and the gas source of the gas cluster ions 40B. However, the gas clusters of the gas mixture are not always the same in composition to the mixing ratio of the gases. In other words, there is also a possibility of a composition shift occurring in the gas clusters of the gas mixture. Accordingly, as in the second embodiment, it is desirable for the gas cluster ions 40A and 40B to be alternately irradiated onto the material to be etched by the gases of the different types being alternately switched. According to such a method, the etching using the gas cluster ions 40A and the etching using the gas cluster ions 40B reliably progress for the entire region of the surface of the material to be etched.

Third Embodiment

Figure 9A:
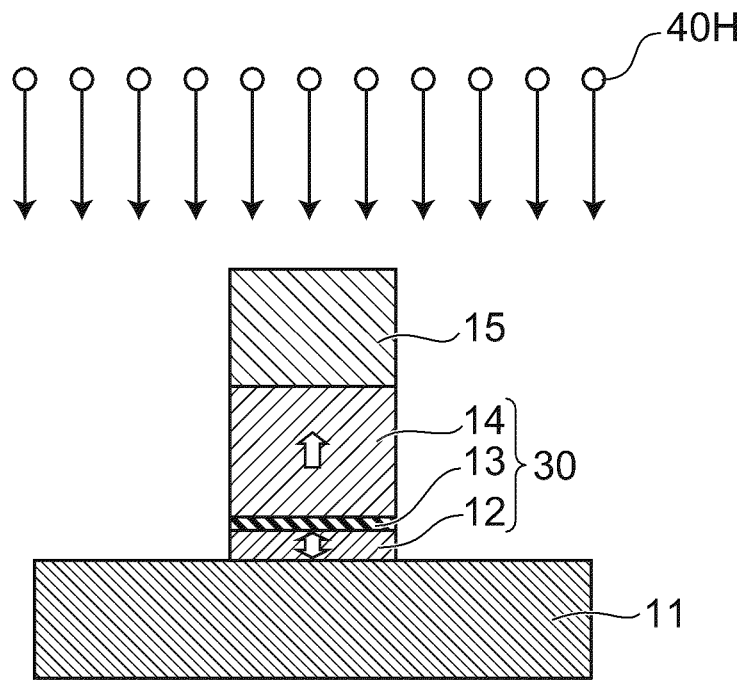
FIGS. 9A and 9B are schematic cross-sectional views illustrating the manufacturing processes of the nonvolatile memory device according to a third embodiment.
Figure 9B:
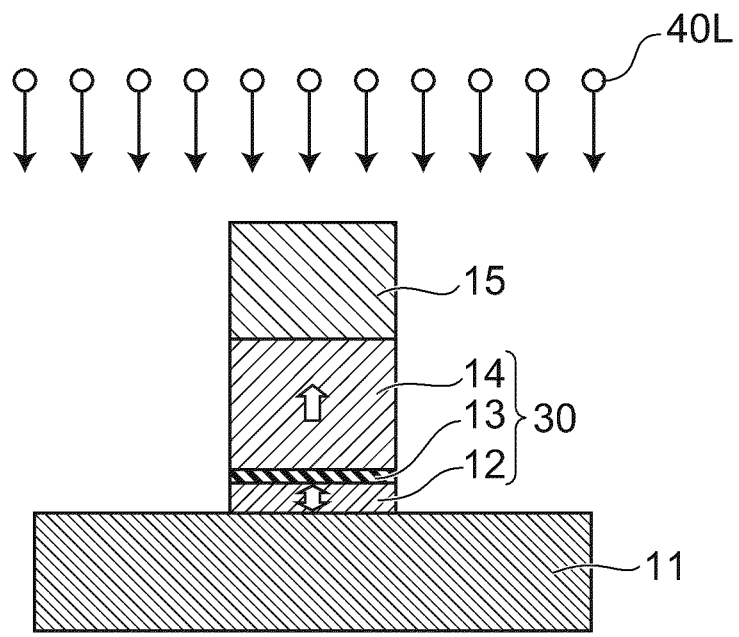

FIGS. 9A and 9B are schematic cross-sectional views illustrating the manufacturing processes of the nonvolatile memory device according to a third embodiment.

In the third embodiment, the gas cluster ions 40 are irradiated onto a portion of the surface of the reference layer 14 or a portion of the surface of the storage layer 12 while changing at least one selected from the kinetic energy per atom or molecule of the gas clusters and the number of the atoms (or the molecules) per gas cluster. In the third embodiment, one selected from the voltage that accelerates the gas cluster ions 40, the gas flow rate supplied to the vacuum processing apparatus 100, the gas flow rate supplied to the pressure cell 109, etc., is modified in a multistep fashion. Thus, a portion of the reference layer 14 and a portion of the storage layer 12 are etched.

For example, the etching of the material to be etched is performed by irradiating gas cluster ions 40L accelerated by a low voltage onto the material to be etched as illustrated in FIG. 9B after gas cluster ions 40H accelerated by a high voltage are irradiated onto the material to be etched as illustrated in FIG. 9A.

Although a high etching rate is obtained by continuously irradiating the gas cluster ions 40H accelerated by the high voltage, there is a possibility that the etching surface may be rough. Accordingly, the etching surface is planarized by irradiating the gas cluster ions 40L accelerated by the low voltage onto the etching surface after irradiating the gas cluster ions 40H.

Figure 10A:
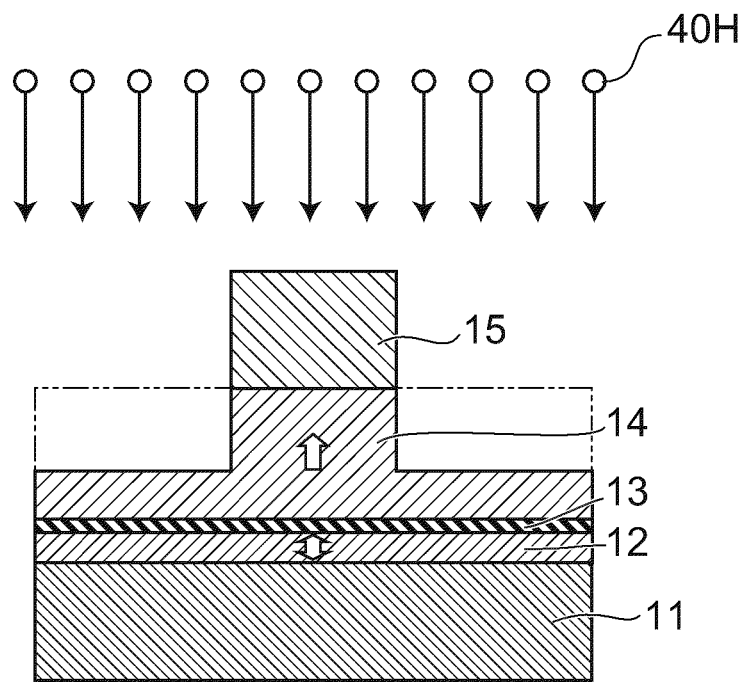
FIGS. 10A and 10B are schematic cross-sectional views illustrating the manufacturing processes of another nonvolatile memory device according to the third embodiment.
Figure 10B:
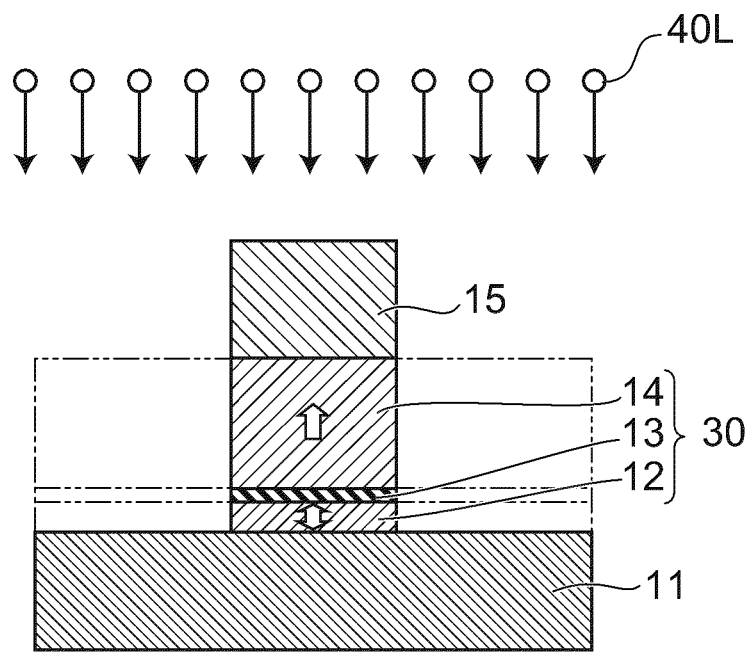

FIGS. 10A and 10B are schematic cross-sectional views illustrating the manufacturing processes of another nonvolatile memory device according to the third embodiment.

For example, in the case where the film thickness of the reference layer 14 is thicker than the film thickness of the storage layer 12 and the reference layer 14 includes a material having a strong etch resistance to the beam of the gas cluster ions 40, the reference layer 14 is patterned partway by irradiating the gas cluster ions 40H accelerated by the high voltage (e.g., 60 kV) as illustrated in FIG. 10A. Next, the voltage that accelerates the gas cluster ions is reduced. Then, as illustrated in FIG. 10B, the remaining reference layer 14, tunneling barrier layer 13, and storage layer 12 are patterned by irradiating the gas cluster ions 40L accelerated by the low voltage (e.g., 10 kV) onto the storage layer 12.

Thereby, a good etched shape is obtained without losing throughput (processing capability); and the damage to the MTJ device 30 is suppressed further. In the case where the roughness of the etching surface becomes pronounced when etching with the high acceleration voltage, the surface roughness can be reduced if the gas flow rate supplied to the high-pressure stagnation region 120 is reduced and the size of the gas clusters is reduced by utilizing the pressure cell 109. Thus, in the third embodiment, a MTJ device 30 having high reliability is fabricated.

As described above, there is a possibility that the material to be etched may suffer thermal damage due to heating of the material to be etched by the irradiation of the ions when the gas cluster ions 40H accelerated by the high voltage are continuously irradiated onto the material to be etched for a long time. In the third embodiment, the heating described above is relaxed by switching to the irradiation of the gas cluster ions 40L accelerated by the low voltage after first irradiating the gas cluster ions 40H accelerated by the high voltage onto the material to be etched. Thereby, the thermal damage to the material to be etched is suppressed.

The number of the atoms (or the molecules) per gas cluster may be reduced when using the gas cluster ions 40L accelerated by the low voltage. Thereby, the energy per atom (or molecule) does not become too small; and the material to be etched can be efficiently patterned.

Fourth Embodiment

Figure 11A:
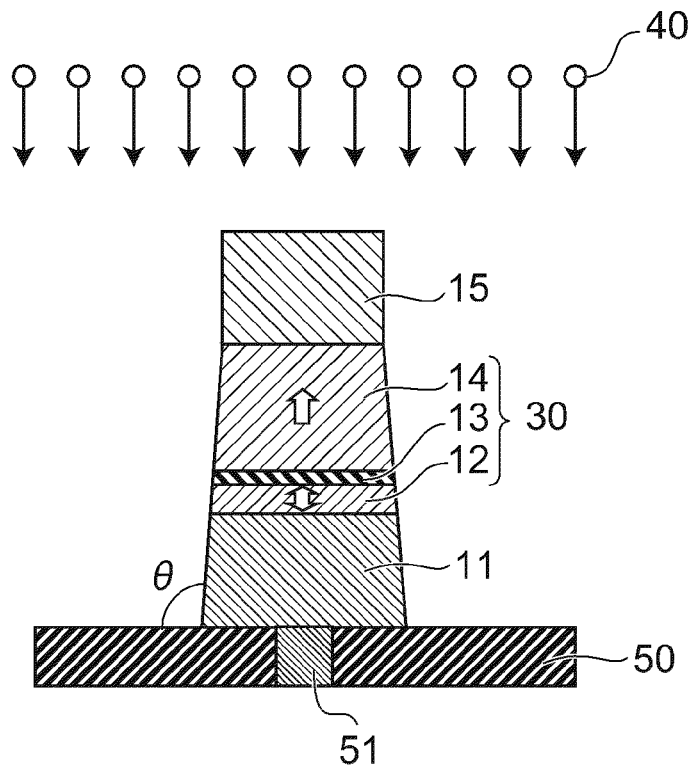
FIGS. 11A and 11B are schematic cross-sectional views illustrating the manufacturing processes of the nonvolatile memory device according to a fourth embodiment.
Figure 11B:
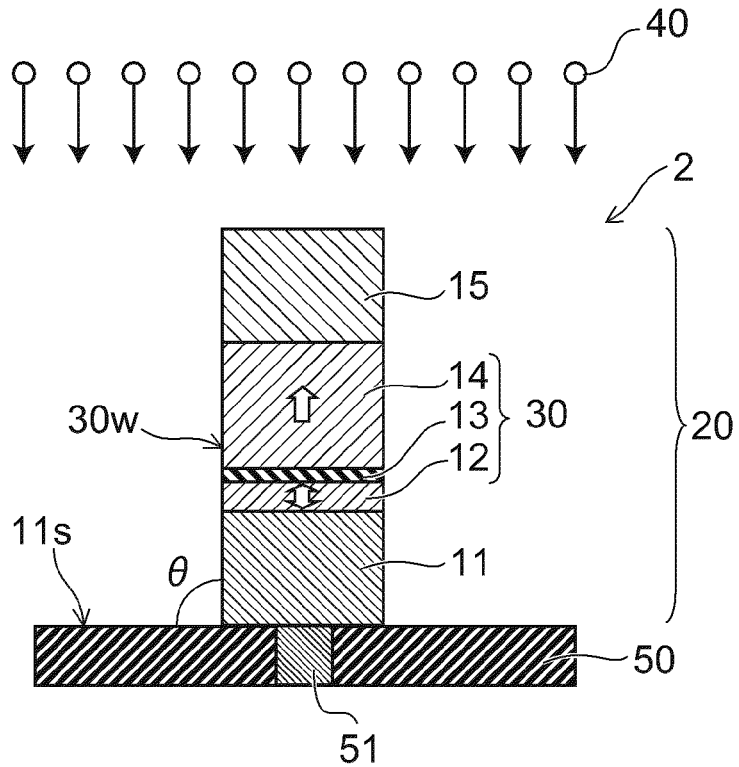

FIGS. 11A and 11B are schematic cross-sectional views illustrating the manufacturing processes of the nonvolatile memory device according to a fourth embodiment.

The gas cluster ions 40 are irradiated onto a portion of the surface of the reference layer 14 or a portion of the surface of the storage layer 12 after forming an etch stop layer 50 under the base layer 11. For example, the interlayer dielectric film 21 described above (not illustrated) is formed under the etch stop layer 50. Aluminum oxide, magnesium oxide, or a combination of aluminum oxide and magnesium oxide may be used as the material of the etch stop layer 50. Thus, a portion of the reference layer 14 and a portion of the storage layer 12 are etched.

In the fourth embodiment as illustrated in FIGS. 11A and 11B, the MTJ device 30 is fabricated with the gas cluster ions 40 by etching to the base layer 11 and by stopping at the etch stop layer 50. According to such a method, the selectivity is good between the etch stop layer 50 and the material of the MTJ device 30 in the dry etching using the gas cluster ions 40 of the $Cl_2$-based gas.

For example, even in the case where a forward-tapered ($\theta$>90°) MTJ device 30 is formed temporarily by the irradiation of the gas cluster ions 40 as illustrated in FIG. 11A, the MTJ device 30 having the perpendicular shape ($\theta$=90°) is easily obtained by continuing the irradiation of the gas cluster ions 40 as illustrated in FIG. 11B. During etching, the etch stop layer 50 is located below the base layer 11. Therefore, the lower interconnects, the MOS transistors, etc., existing below the base layer 11 are not etched and the lower interconnects, the MOS transistors, etc., existing below the base layer 11 are not damaged even in the case where the gas cluster ions 40 are continuously irradiated. Thus, the perpendicular shape of the MTJ device 30 can be easily obtained by using the etch stop layer 50. Thereby, an device structure that is optimal for nanoelectronics can be formed.

In the case where an insulator material is used as the etch stop layer 50, it is necessary to draw out the lower electrode in the lateral direction; and the structure of the nonvolatile memory device becomes complex. In the fourth embodiment, a contact electrode 51 having a via configuration is provided inside the etch stop layer 50. Thereby, it is possible to connect the MTJ device 30 to the interconnects (not illustrated) provided below the etch stop layer 50. In the case where the contact electrode 51 having the via configuration is used, a thick metal interconnect layer, which is necessary to draw out the lower electrode inside the base layer 11, becomes unnecessary. The base layer 11 includes a barrier metal layer and a buffer layer for depositing the flat magnetic layer having the perpendicular magnetization and does not include such a thick metal interconnect layer.

The nonvolatile memory device 2 illustrated in FIG. 11B includes multiple memory cells 20. Each of the memory cells 20 of the nonvolatile memory device 2 includes the base layer 11, the MTJ device 30 provided on the base layer 11, the etch stop layer 50 provided under the base layer 11, and the upper electrode 15 provided on the MTJ device 30. The storage layer 12 of the MTJ device 30 is electrically connected by the contact electrode 51 to the interconnect provided under the base layer 11.

Fifth Embodiment

Figure 12:
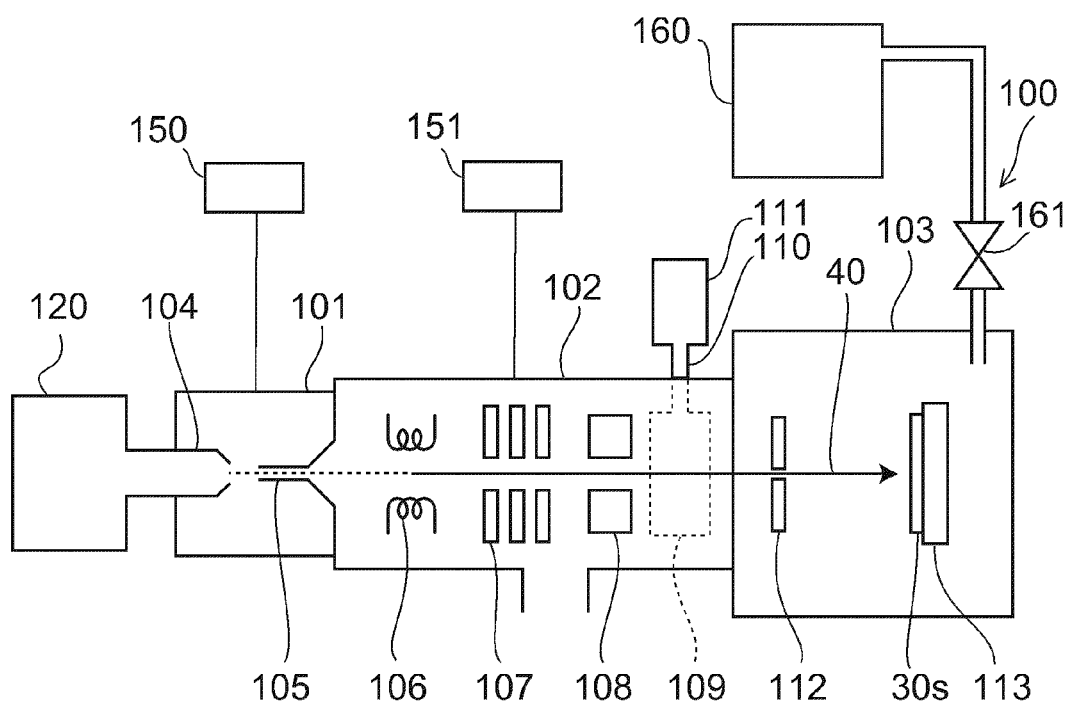
FIG. 12 is a schematic cross-sectional view for describing an overview of a vacuum processing apparatus according to a fifth embodiment.

FIG. 12 is a schematic cross-sectional view for describing an overview of a vacuum processing apparatus according to a fifth embodiment.

In the fifth embodiment, while exposing the surface of the processing substrate 30s, namely a portion of the surface of the reference layer 14 or a portion of the surface of the storage layer to a reaction gas atmosphere, the surface is irradiated with the gas cluster ions 40 and the processing substrate 30s is etched.

As shown in FIG. 12, a gas supply mechanism 160 of the reaction gas is connected to the cluster irradiation chamber 103 of the vacuum processing apparatus 100, and a valve 161 that is configured to control the gas supply to the cluster irradiation chamber 103 is provided on the way.

For example, the reaction gas of HCl or HF is introduced into the cluster irradiation chamber 103 from the gas supply mechanism 160, and a partial pressure of HCl or HF at that time is controlled to be approximately $1 \times 10^{-5}$ Torr by the valve 161.

The reaction gas of HCl or HF introduced into the cluster irradiation chamber adsorbes on the surface of the processing substrate 30s. If the processing substrate 30s is irradiated with the gas cluster ions 40 of $O_2$ in this condition, the adsorbed reaction gas reacts with the cluster ions of $O_2$ to produce etching reaction, and a portion of the MTJ device 30 as shown in FIG. 1 can be etched effectively.

The hard-to-etch materials such as noble metals or the like are known to perform an oxidative dissolution reaction assisted by an oxidant, the cluster ions of $O_2$ oxidize the metal and give energy necessary for the etching reaction to promote the etching reaction by the adsorbed reaction gas.

Generally, in the case of etching by gas cluster ions, cluster formation condition is different dependent on gas species, thereby mixed clusters mixing multiple reaction gases or noble gases are difficult to be formed. Even in this case, in the gas cluster ion assisted etching using the gas cluster ion irradiation in the reaction gas atmosphere described above, the reaction gas species and the irradiating cluster ion can be selected freely. Therefore, magnetic metals or the like being usually the hard-to-etch materials can be etched effectively. In the etching using the gas supply mechanism 160, a liquefied gas being difficult for cluster formation in usual, and a compound having a large molecular weight such as organic acids also can be used for the etching reaction.

The gas supplied from the gas supply mechanism 160 includes at least one type of gas selected from the group consisting of a halogen gas ($F_2$, $CHF_3$, $CF_4$, $C_2F_6$, $C_2HF_5$, $CHClF_2$, $NF_3$, $SF_6$, $ClF_3$, $Cl_2$, HCl, HF, $CClF_3$, $CHCl_3$, $CBrF_3$, $Br_2$, etc.), nitric acid ($HNO_3$), phosphoric acid ($H_3PO_4$), sulfuric acid ($H_2SO_4$), hydrogen peroxide ($H_2O_2$), acetic acid ($CH_3COOH$), formic acid (HCOOH), carbon dioxide ($CO_2$), carbon monoxide (CO), nitrogen ($N_2$), oxygen ($O_2$), ammonia ($NH_3$), dinitrogen monoxide ($N_2O$) and methyl ether ($CH_3OCH_3$).

The partial pressure of the reaction gas supplied from the gas supply mechanism 160 is favorable to be appropriately on the order of $1 \times 10^{-5}$ Torr. In a partial pressure lower than this, enough reaction gas cannot be supplied onto the surface of the processing substrate 30s, thereby the etch reaction is not fully produced, and the enough etch rate cannot be achieved. In a partial pressure higher than this, an adsorption amount of the reaction gas species onto the processing substrate 30s saturates and the etch rate saturates, furthermore collisions between the entering cluster ions and the atmosphere gases occur to decay the cluster ions before arriving at the processing substrate 30s.

Sixth Embodiment

In the sixth embodiment, in the etching process of the MTJ device 30, first, an ion beam etching (hereinafter, also referred to as IBE) or a reactive ion etching (hereinafter, also referred to as RIE) is performed. Subsequently, the MTJ device 30 is etched using a gas cluster ion beam (hereinafter, also referred to as GCIB) method.

For example, after the Ta metal mask 15 is patterned (for example, FIGS. 9A and 9B), the reference layer 14 is etched by Ar ion beam with beam energy of 200 eV while changing an irradiation angle from 30 degrees to 0 degree (angles to surface normal) repeatedly. The etching is stopped when the tunneling barrier layer 13 and the storage layer 12 under the tunneling barrier layer are exposed.

At this time, there was a problem that etch by-products which adhere to the sidewalls of the reference layer 14, the tunneling barrier layer 13, and the storage layer 12 form a redeposition layer, and reduce a resistance of the tunneling barrier layer 13. In the embodiment, as shown in the following, after the above process, the redeposition layer adhered to the sidewalls of the reference layer 14, the tunneling barrier layer 13, and the storage layer 12 is removed by the GCIB etching.

As described above, comparing with GCIB difficult for overall irradiation, use of IBE allows the effective etching.

Subsequently, the sample is moved to the GCIB etching chamber, for example, clusters from $Cl_2$ gas with a relatively high total energy are irradiated with an energy of 10 eV per one atom and the storage layer 12 is etched. The GCIB irradiation is stopped when the lower electrode layer under the storage layer is exposed.

Furthermore, the GCIB etching is performed using the gas including at least one noble gas selected from the group consisting of Xe, Kr, Ar and Ne, thereby residual chlorine by-products adhered to the sidewalls of the reference layer 14, the tunneling barrier layer 13, and the storage layer 12 can be removed.

In stead of chlorine gas, clusters containing nitrogen and oxygen may be irradiated to nitride or oxidize the redeposition. This reduces an electrical conductance of the redeposition and suppresses reduction of the resistance of the tunneling barrier layer 13.

Furthermore, after the etching using GCIB of chlorine, the GCIB irradiation with a relatively low energy Ar, for example, an irradiation with an energy of 1 eV per one atom is performed, and this allows the chlorine-containing by-products on the sidewall to be removed effectively. At this time, setting a beam incident angle not less than 10 degrees from the surface normal allows the effective etching of the adsorbed by-products on the sidewall of the reference layer 14 and the storage layer 12. This produces an effect not only on removing residual chloride on the etched surface but also on recovering introduced damages by giving an adequate lattice vibration locally on the etched surface (a kind of annealing effect).

The GCIB irradiation using chlorine gas is desired to be performed with a dose modifying the etch rate distribution of IBE. For example, when an etch rate at the center portion is higher than an etch rate at the periphery in IBE, the irradiation is performed under the condition that the dose at the periphery is increased.

Gases used for GCIB after IBE are not limited to the halogen-based gas such as $Cl_2$ etc. Other methods include, for example, three steps as describe below. First, the reference layer 14, the tunneling barrier layer 13, and the storage layer 12 are etched with IBE using Ar gas. Second, The redeposition layer formed on the sidewalls of the reference layer 14, the tunneling barrier layer 13, and the storage layer 12 is caused to be nonconductive by IBE using a gas including oxygen or nitrogen. Third, for example, the nonconductive redeposition layer is removed or thinned by the GCIB etching using the noble gas including Kr or Xe.

In stead of IBE described above, an another etching method which can etch whole wafer such as RIE etc. may be used.

As described above, according to the embodiment, by adding IBE or RIE to the GCIB etching, the by-products formed on the surface of the material to be etched can be volatilized from the surface of the material to be etched efficiently and the MTJ device 30 having a perpendicular shape can be fabricated. That is, applying the above method which makes it possible to etch whole wafer can shorten the process time and reduce the manufacturing cost compared with the method with only the GCIB etching.

Seventh Embodiment

In the seventh embodiment, the MTJ device 30 is etched using the not-ionized gas cluster beam (GCB).

In the case of the irradiation with applying an electric field to ionized gas clusters, energy per one atom or one molecule changes in response to the distribution of cluster size. Therefore, clusters with a small size are implanted into the substrate with large kinetic energy per one atom or one molecule. At this time, the MTJ device 30 is irradiated with high energy atoms, and may be damaged.

The clusters without ionization (Gas Cluster Beam: GCB) collide with the substrate at a nearly sonic velocity. The kinetic energy per one or one molecule of not-ionized gas cluster beam is not likely dependent on the cluster size. Even if the kinetic energy per one atom or one molecule depends on the cluster size, the kinetic energy of each atom is suppressed to be not more than 1 eV, and thus the damage to the MTJ device 30 is fully suppressed.

Gas generated in a vapor generator or an ultrasonic cluster vapor generator (not shown) is pressurized in the high-pressure stagnation region 120. When the pressurized gas is released into the cluster formation chamber 101 through the nozzle 104, the gas is adiabatically expanded in the vicinity of the tip of the nozzle 104. Then, the gas is cooled in the cluster formation chamber 101 and multiple gas clusters are generated in the cluster formation chamber 101. Each of the gas clusters flows through the skimmer 105 to form a beam configuration, and subsequently is introduced into the ionization chamber 102 and process chamber 103 without using ionizor 106. In the process chamber 103, the neutral clusters collide with the substrate at a sonic velocity. Thereby, non-ionized gas clusters having a beam configuration are irradiated.

HCl clusters generated by using the vaporized gas are illustratively used as the non-ionized gas cluster beam. In this case, simultaneously flowing the noble gas such as Ar etc. through the nozzle allows the HCl clusters to be suppressed from growing mammoth at the adiabatic expansion. The processing substrate 30s is irradiated with this gas cluster beam, and the MTJ device 30 is etched.

This can suppress the damage of the MTJ device 30 arising at implantation of the gas cluster ions.

The material to be etched may be subjected to oxidation treatment simultaneously or alternately with the etching by the HCl gas clusters. This oxidation treatment is performed, for example, by methods of etching with the vaporized gas of chemicals such as $H_2O_2$ with oxidation and reducing character, and simultaneous or alternate irradiation of the $O_2$ gas cluster ions and the HCl gas clusters using two sets of nozzles installed.

The gas used for the gas cluster irradiation includes at least one type of gas selected from the group consisting of a halogen-containing gas ($F_2$, $CHF_3$, $CF_4$, $C_2F_6$, $C_2HF_5$, $CHClF_2$, $NF_3$, $SF_6$, $ClF_3$, $Cl_2$, $HF$, $CClF_3$, $CHCl_3$, $CBrF_3$, $Br_2$ etc.), nitric acid ($HNO_3$), phosphoric acid ($H_3PO_4$), sulfuric acid ($H_2SO_4$), hydrogen peroxide ($H_2O_2$), acetic acid ($CH_3COOH$), formic acid ($HCOOH$), carbon dioxide ($CO_2$), carbon monoxide (CO), nitrogen ($N_2$), oxygen ($O_2$), ammonia ($NH_3$), dinitrogen monoxide ($N_2O$) and methyl ether ($CH_3OCH_3$) etc.

Hereinabove, exemplary embodiments of the invention are described with reference to specific examples. However, the embodiments are not limited to these specific examples. In other words, appropriate design modifications made by one skilled in the art to these specific examples also are within the scope of the embodiments to the extent that the features of the embodiments are included. The components included in the specific examples described above and the dispositions, the materials, the conditions, the configurations, the sizes, etc., of the components are not limited to those illustrated and may be modified appropriately.

For example, other than the etching of a portion of the reference layer 14 and a portion of the storage layer 12 using the gas cluster ions 40, a method for etching the portion of the reference layer 14 or the portion of the storage layer 12 using the gas cluster ions 40 also is included in the embodiments. In the case of etching the portion of the reference layer 14 or the portion of the storage layer 12 using the gas cluster ions 40 as well, the sidewall of the reference layer 14 after the patterning or the sidewall of the storage layer 12 after the patterning is of course substantially perpendicular to the major surface of the base layer 11.

The components included in the embodiments described above can be used in combinations within the extent of technical feasibility; and such combinations are included in the scope of the embodiments to the extent that the features of the embodiments are included. Furthermore, various modifications and alterations within the spirit of the embodiments will be readily apparent to those skilled in the art; and all such modifications and alterations should therefore be seen as within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a nonvolatile memory device including a plurality of memory cells,
    each of the plurality of memory cells including:
        a base layer including a first electrode;
        a magnetic tunnel junction device provided on the base layer; and
        a second electrode provided on the magnetic tunnel junction device,
    the magnetic tunnel junction device including:
        a first magnetic layer;
        a tunneling barrier layer provided on the first magnetic layer; and
        a second magnetic layer provided on the tunneling barrier layer,
    the method comprising etching a portion of the second magnetic layer and a portion of the first magnetic layer by irradiating gas clusters onto a portion of a surface of the second magnetic layer or a portion of a surface of the first magnetic layer while reducing voltage accelerating the gas cluster ions.

2. The method according to claim 1, wherein the gas clusters are ionized.

3. The method according to claim 1, wherein the gas clusters are irradiated perpendicularly to a major surface of the base layer.

4. The method according to claim 1, wherein the gas clusters are irradiated non-perpendicularly to a major surface of the base layer.

5. The method according to claim 1, wherein
    the first magnetic layer has an easy magnetization axis in a direction substantially perpendicular to a major surface of the first magnetic layer, and a magnetization direction of the first magnetic layer is changeable, and
    the second magnetic layer has an easy magnetization axis in a direction substantially perpendicular to a major surface of the second magnetic layer, and a magnetization direction of the second magnetic layer is fixed.

6. The method according to claim 2, wherein
    a kinetic energy per one of atoms or one of molecules included in the gas clusters directly prior to the irradiating of the gas clusters onto the portion of the surface of the second magnetic layer or the portion of the surface of the first magnetic layer is not more than 30 eV, and
    the kinetic energy is adjusted to be not more than 30 eV after the gas clusters are formed, the gas clusters being ionized.

7. The method according to claim 1, wherein the gas clusters are first gas clusters including a first gas or second gas clusters including a second gas having a gas type different from a gas type of the first gas, the first gas clusters and the second gas clusters are ionized, and the first gas clusters and the second gas clusters are alternately irradiated onto the portion of the surface of the second magnetic layer or the portion of the surface of the first magnetic layer.

8. The method according to claim 1, wherein the gas clusters are irradiated onto the portion of the surface of the second magnetic layer or the portion of the surface of the first magnetic layer while changing at least one selected from a kinetic energy per one of atoms or one of molecules included in one of the gas clusters and a number of the atoms or molecules included in one of the gas clusters.

9. The method according to claim 1, wherein the gas clusters are irradiated onto the portion of the surface of the second magnetic layer or the portion of the surface of the first magnetic layer while changing at least one selected from a kinetic energy per one of atoms or one of molecules included in one of the gas clusters and a number of the atoms or molecules included in one of the gas clusters in a multistep fashion.

10. The method according to claim 1, wherein at least one material selected from the group consisting of tantalum, tungsten, titanium nitride, titanium silicon nitride, tantalum silicon nitride, silicon oxide, aluminum oxide, carbon, and silicon carbide is used as a mask material of the first magnetic layer and a mask material of the second magnetic layer when etching the portion of the second magnetic layer and the portion of the first magnetic layer.

11. The method according to claim 1, wherein the gas clusters are irradiated onto the portion of the surface of the second magnetic layer or the portion of the surface of the first magnetic layer after forming an etching stop layer under the base layer.

12. The method according to claim 1, wherein not less than 1000 and not more than 10000 atoms or molecules are included in the gas clusters.

13. The method according to claim 1, wherein the portion of the surface of the second magnetic layer or the portion of the surface of the first magnetic layer is exposed to a reaction gas in the etching.

14. The method according to claim 13, wherein the reaction gas includes at least one type of gas selected from the group consisting of a halogen-containing gas, nitric acid, phosphoric acid, sulfuric acid, hydrogen peroxide, acetic acid, formic acid, carbon dioxide, carbon monoxide, nitrogen, oxygen, ammonia, dinitrogen monoxide and methyl ether.

15. The method according to claim 1, wherein ion beam etching or reactive ion etching is performed before the gas clusters are irradiated onto the portion of the surface of the second magnetic layer or the portion of the surface of the first magnetic layer.

16. The method according to claim 1, wherein the gas clusters are not ionized.

17. The method according to claim 16, wherein a kinetic energy per one of atoms or one of molecules included in one of the gas clusters directly prior to the irradiating of the gas clusters onto the portion of the surface of the second magnetic layer or the portion of the surface of the first magnetic layer is not more than 1 eV.

18. The method according to claim 16, wherein the gas clusters include at least one type of gas selected from the group consisting of a halogen-containing gas, carbon dioxide, carbon monoxide, nitrogen, oxygen, ammonia, dinitrogen monoxide, methyl ether, nitric acid, phosphoric acid, sulfuric acid, hydrogen peroxide, acetic acid, formic acid, and a noble gas.

19. The method according to claim 1, wherein the gas clusters include first gas clusters including a first gas or second gas clusters including a second gas having a gas type different from a gas type of the first gas, the first gas clusters and the second gas clusters are ionized, and the first gas clusters and the second gas clusters are simultaneously or alternately irradiated onto the portion of the surface of the second magnetic layer or the portion of the surface of the first magnetic layer.

20. The method according to claim 1, wherein the gas clusters include at least one type of gas selected from the group consisting of $CHF_3$, $CF_4$, $C_2F_6$, $C_2HF_5$, $CHClF_2$, $ClF_3$, $HCl$, $CClF_3$, $CHCl_3$, $CBrF_3$, and methyl ether.

21. The method according to claim 1, wherein the gas clusters includes at least one type of gas selected from the group consisting of halocarbon, two or more kinds of halogen, acid, and ether.

* * * * *